United States Patent [19]

Hidaka et al.

[11] Patent Number: 5,461,589
[45] Date of Patent: Oct. 24, 1995

[54] BIT LINE STRUCTURE FOR SEMICONDUCTOR MEMORY DEVICE WITH BANK SEPARATION AT CROSS-OVER REGIONS

[75] Inventors: Hideto Hidaka; Kazuyasu Fujishima; Yoshio Matsuda, all of Hyogo, Japan

[73] Assignee: Mitsubishi Denki Kabushiki Kaisha, Tokyo, Japan

[21] Appl. No.: 145,733

[22] Filed: Nov. 4, 1993

Related U.S. Application Data

[62] Division of Ser. No. 28,906, Mar. 8, 1993, Pat. No. 5,280,443, which is a division of Ser. No. 876,690, Apr. 28, 1992, Pat. No. 5,214,601, which is a continuation of Ser. No. 430,915, Oct. 31, 1989, abandoned, which is a continuation of Ser. No. 131,633, Dec. 11, 1987, abandoned.

[30] Foreign Application Priority Data

Dec. 11, 1986 [JP] Japan .................................. 61-296365
Mar. 24, 1987 [JP] Japan .................................. 62-69828
Mar. 27, 1987 [JP] Japan .................................. 62-75692

[51] Int. Cl.$^6$ .................................................... G11C 7/02
[52] U.S. Cl. ...................... 365/208; 365/72; 365/189.09; 365/210; 365/230.06
[58] Field of Search .................................... 365/190, 207, 365/208, 63, 72, 230.06, 189.09, 210

[56] References Cited

U.S. PATENT DOCUMENTS

| 3,942,164 | 3/1976 | Dunn . |
| 4,117,545 | 9/1978 | Indachi . |
| 4,476,547 | 10/1984 | Miyasaka . |
| 4,570,241 | 2/1986 | Arzuki ........................... 365/205 |
| 4,598,387 | 7/1986 | Chuang et al. . |
| 4,733,374 | 3/1988 | Furuyama et al. . |
| 4,748,596 | 5/1988 | Ogura et al. ........................... 365/207 |
| 4,757,476 | 7/1988 | Fujishima et al. . |
| 4,803,663 | 2/1989 | Miyamoto et al. . |
| 4,922,459 | 5/1990 | Hidaka . |
| 4,980,860 | 12/1990 | Houston et al. . |
| 5,214,601 | 5/1993 | Hidaka et al. . |

FOREIGN PATENT DOCUMENTS

| 0167281A2 | 1/1986 | European Pat. Off. . |
| 067281 | 1/1986 | European Pat. Off. . |
| 60-254489 | 12/1985 | Japan . |
| 0254489 | 12/1985 | Japan . |
| 62-51096 | 3/1987 | Japan . |

OTHER PUBLICATIONS

LBM J. Res. Develop.: "VLSI Wiring Capacitance", by Peter E. Cottrell et al., vol. 29, No. 3, May 1985 pp. 277–288.
Hidaka et al., "Twisted Bit–Line Architectures for Multi–Megabit DRAM's", IEEE Journal of Solid–State Circuits, vol. 24, No. 1, (Feb. 1989), pp. 21–27.
Yoshihara et al., "A Twisted Bit Line Technique for Multi–Mb DRAMS", 1989, IEEE International Solid–State Circuits Conference Digest of Technical Papers (Feb. 19, 1980), pp. 238–239.

(List continued on next page.)

Primary Examiner—Joseph E. Clawson, Jr.
Attorney, Agent, or Firm—Lowe, Price, LeBlanc & Becker

[57] ABSTRACT

A semiconductor memory device of folded bit line structure provided with a cross portion in at least one portion of each of bit line pairs so that values of coupling capacitance with adjacent bit line pairs are equal to each other with respect to the paired bit lines.

Preferably, the respective bit line pairs are equally divided into 4N and the cross parts are provided at dividing points so that bit line pairs having the cross parts at the same dividing points are arranged on alternate pairs of bit lines.

Preferably, the cross parts are provided in regions for forming restore circuits or sense amplifiers.

More preferably, a dummy word line for selecting dummy cells for providing reference potential is selected by the position of a selected word line.

4 Claims, 16 Drawing Sheets

OTHER PUBLICATIONS

Aoki et al., "A 60–ns 16–Mbit CMOS DRAM with a Transposed Data–Line Structure", IEEE Journal of Solid–State Circuits, vol. 23, No. 5, (Oct. 1988), pp. 1113–1119.

Chou et al., "A 60–ns 16Mbit DRAM with a Minimized Sensing Delay Caused by Bit–Line Stray Capacitance", IEEE Journal of Solid–State Circuits, vol. 24, No. 5, (Oct. 1989), pp. 1176–1183.

//5,461,589//

BIT LINE STRUCTURE FOR SEMICONDUCTOR MEMORY DEVICE WITH BANK SEPARATION AT CROSS-OVER REGIONS

This application is a division of application Ser. No. 08/028,906 filed Mar. 8, 1993, now U.S. Pat. No. 5,280,443, which was a division of application Ser. No. 07/876,690, now U.S. Pat. No. 5,214,601, filed Apr. 28, 1992, which was a continuation of application Ser. No. 07/430,915, now abandoned, filed Oct. 31, 1989, which was a continuation of application Ser. No. 07/131,633, now abandoned, filed Dec. 11, 1987. Co-pending U.S. patent application Ser. No. 08/028,917 filed Mar. 8, 1993 is hereby incorporated by reference.

BACKGROUND OF THE INVENTION

1. Field of the Invention

The present invention relates to bit line structure for a semiconductor memory device, and more particularly, it relates to structure of bit lines for preventing information signal readout errors in a dynamic type semiconductor memory device.

2. Description of the Prior Art

FIG. 1 shows an exemplary an structure of a general semiconductor memory device.

Referring to FIG. 1, the semiconductor memory device comprises a memory cell array 100 which is formed by a plurality of memory cells arrayed in the form of a matrix of rows and columns, an address buffer 101 which receives externally supplied address signals Ext.ADD to output internal row address signals $A_0$ to $A_n$ and internal column address signals $B_0$ to $B_m$, a row decoder 102 which receives the internal row address signals $A_0$ to $A_n$ to select a corresponding row from the memory cell array 100, an (I/O+ sense amplifier) part 104 which is formed by a sense amplifier part for detecting and amplifying information appearing on respective columns of the memory cell array 100 and an I/O part for connecting the information amplified by the sense amplifier part to an output buffer 103, a column decoder 105 which selects a column from the memory cell array 101 in response to the internal column address signals $B_0$ to $B_m$ to transmit information on the selected column to the output buffer 103 through the I/O part of the (I/O+sense amplifier) part 104 and the output buffer 103 which receives the information on the column selected by the column decoder 105 through the I/O part to output the same. It is to be noted that FIG. 1 shows only a data read system of the semiconductor memory device.

FIG. 2 shows the structure of a bit line part of the conventional dynamic type semiconductor memory device, which bit line part corresponds to a region enclosed by broken lines in FIG. 1.

FIG. 2 merely shows two word lines $WL_0$ and $WL_1$, two bit lines BL and $\overline{BL}$, two dummy word lines $DWL_0$ and $DWL_1$ and a sense amplifier SA, for convenience of illustration.

A column of memory cells are connected to each of the word lines $WL_0$ and $WL_1$ while a row of memory cells are connected to each of the bit lines BL and $\overline{BL}$.

The bit lines BL and $\overline{BL}$ are paired to form the so-called folded bit line. Therefore, memory cells are provided in intersections between the word line WL and the bit line BL and between the word line $WL_1$ and the bit line $\overline{BL}$ respectively. Although not shown in the figure, memory cells are similarly provided in intersections between the bit line BL and alternate word lines as well as between the bit line $\overline{BL}$ and alternate word lines.

A sense amplifier SA for detecting and amplifying potential difference on the paired bit lines BL and $\overline{BL}$ is formed by cross-coupled NMOS transistors. This sense amplifier SA is activated in response to a sense amplifier activating signal $\phi_S$, to pull down a lower potential of one of the bit lines BL and $\overline{BL}$ to a low potential (ground potential).

The sense amplifier activating signal $\phi_S$ is supplied to the gate of a switching transistor $Q_2$. One conducting terminal of the switching transistor $Q_2$ is connected to the ground potential and the other conducting terminal is connected to first conducting terminals of both MOS transistors of the sense amplifier SA. Second conducting terminals of the MOS transistors of the sense amplifier SA are connected with the bit lines BL and $\overline{BL}$ respectively.

The dummy word lines $DWL_0$ and $DWL_1$ are provided with dummy cells $DC_0$ and $DC_1$ for supplying a reference potential during operation of the sense amplifier SA. The dummy cell $DC_0$ is provided in the intersection between the dummy word line $DWL_0$ and the bit line BL, and the dummy cell $DC_1$ is provided in the intersection between the dummy word line $DWL_1$ and the bit line $\overline{BL}$.

Each of memory cells $MC_0$ and $MC_1$ for storing information is a one-transistor/one-capacitor type memory cell which has a memory cell capacitor CS for storing information in the form of charges and a transfer gate TG being turned on/off in response to the word line potential for connecting the memory cell capacitor CS to the bit line BL or $\overline{BL}$.

Each of the dummy cells $DC_0$ and $DC_1$ is structured similarly to the memory cell, and stores a quantity of charges equal to half that stored in the memory cell capacitor in a high-level state.

Transfer gates $Q_1$ and $Q_1'$ are provided in order to connect a bit line pair selected in response to a column address signal from the column decoder 105 to a pair of data input/output lines I/O and $\overline{I/O}$. The transfer gate $Q_1$ connects the bit line BL to the data input/output line I/O, and the transfer gate $Q_1'$ connects the bit line $\overline{BL}$ to the data input/output line $\overline{I/O}$. These transfer gates $Q_1$ and $Q_1'$ are supplied in their gates with the output of the column decoder 105.

With reference to FIG. 1, description is now briefly made on operation for data reading.

Each bit line is precharged at the potential $V_{CC}$ until a word line is selected and the potential of the selected word line rises. Then, when a word line (e.g., $WL_0$) is selected by the output of the row decoder 102, the dummy word line $DWL_1$ is simultaneously selected so that the memory cell $MC_0$ is connected to the bit line $BL_1$ and the dummy cell $DC_1$ is connected to the bit line $\overline{BL_1}$. The dummy cells $DC_1$ and $DC_0$ store quantities of charges of $\frac{1}{2} V_{CC} C_S$, where $V_{CC}$ is a supply potential and $C_S$ is a capacitance of a memory capacitor.

A potential responsive to the information stored in the memory cell $MC_0$ appears on the bit line $BL_1$, which potential on the bit line $BL_1$ is higher or lower than a potential on the bit line $\overline{BL_1}$, whereby potential difference is caused between the bit lines $BL_1$ and $\overline{BL_1}$. Then the sense amplifier activating signal $\phi_S$ goes high and the transfer gate $Q_2$ enters an ON state, thereby to activate the sense amplifier SA. Thus, the potential difference between the paired bit lines $BL_1$ and $\overline{BL_1}$ is amplified (the lower potential one of the bit lines is discharged to the ground potential level).

Then the transfer gates $Q_1$ and $Q_1'$ enter ON states by the output of the column decoder 105, so that the bit lines $BL_1$ and $\overline{BL_1}$ are connected to the data input/output lines I/O and $\overline{I/O}$ respectively, to read out the data.

Then, the potentials appearing on the bit lines are obtained.

FIG. 3 illustrates parasitic capacitance present on each bit line.

Each of the bit lines $BL_0$ to $BL_2$ and $\overline{BL_0}$ to $\overline{BL_2}$ has capacitance $C_1$ with respect to the ground potential (fixed potential), capacitance $C_2$ with respect to the bit line paired with the same and capacitance $C_3$ with respect to the bit line of the adjacent bit line pair. It is assumed here that each bit line has length 1 and the memory cell capacitor CS has capacitance $C_s$.

Each memory cell stores charges of $C_s V_{CC}$ ($V_{CC}$ writing) in "H" storage and 0 (0 V writing) in "L" storage. "$V_{CC}$ writing" and "0 V writing" indicate potentials supplied to the bit lines in information writing respectively.

Each dummy cell for supplying the reference potential to the bit line stores charges of ½ $C_s V_{CC}$ (½ $V_{CC}$ writing in capacitance $C_s$ etc.).

Each bit line is precharged at the potential $V_{CC}$ until a word line is selected by the output of the row decoder 102 and the potential of the selected word line rises at a potential exceeding $V_{CC}$.

With reference to FIG. 3, consider that the memory cells connected to the bit line $BL_1$ are selected and dummy cells are connected to the bit line $\overline{BL_1}$. In this case, a dummy word line is so selected that the selected memory cells are connected to one of paired bit lines and the dummy cells are connected to the other bit line.

When the selected word line rises at a potential exceeding $V_{CC}$, potentials on the bit lines $BL_1$ and $\overline{BL_1}$ are provided as follows:

In case of "L" reading:

$$V(BL_1) = V_{CC} - \frac{C_s \cdot V_{CC}}{C_1 + C_2 + C_3} + \frac{C_3}{C_1 + C_2 + C_3} \Delta V(\overline{BL_0}) + \frac{C_2}{C_1 + C_2 + C_3} \Delta V(\overline{BL_1}) \quad (1)$$

In case of "H" reading:

$$V(BL_1) = V_{CC} + \frac{C_3}{C_1 + C_2 + C_3} \Delta V(\overline{BL_0}) + \frac{C_3}{C_1 + C_2 + C_3} \Delta V(\overline{BL_1}) \quad (2)$$

$$V(\overline{BL_1}) = V_{CC} - \frac{1/2 \cdot C_s \cdot V_{CC}}{C_1 + C_2 + C_3} + \frac{C_2}{C_1 + C_2 + C_3} \Delta V(BL_1) + \frac{C_3}{C_1 + C_2 + C_3} \Delta V(BL_2) \quad (3)$$

where $\Delta V(\overline{BL_0})$, $\Delta V(\overline{BL_1})$, $\Delta V(BL_1)$ and $\Delta V(BL_2)$ represent potential variations appearing on the bit lines $\overline{BL_0}$, $\overline{BL_1}$, $BL_1$ and $BL_2$ respectively.

Since precharge levels of the bit lines $BL_1$ and $\overline{BL_1}$ are equally at $V_{CC}$, the potential difference between the bit lines $BL_1$ and $\overline{BL_1}$ is obtained from the expressions (1)–(3) and (2)–(3) as follows:

$$\Delta V_S = V(\overline{BL_1}) - V(\overline{BL_1}) = \Delta V(BL_1) - \Delta V(\overline{BL_1}) \quad (4)$$

-continued $$= \pm \frac{1}{1+\alpha} \cdot \frac{\beta}{2} + \frac{\gamma}{1+\alpha} \cdot (\Delta V(\overline{BL_0}) - \Delta V(BL_2))$$

where $$\alpha = \frac{C_2}{C_1 + C_2 + C_3},$$

$$\beta = \frac{C_s \cdot V_{CC}}{C_1 + C_2 + C_3},$$

$$\gamma = \frac{C_3}{C_1 + C_2 + C_3}.$$

Sign "+" indicates "H" reading and sign "–" indicates "L" reading.

In the above expression (4), the first term in the right side represents original readout potential difference, and the second term in the right side expresses noise components from the bit lines $\overline{BL_0}$ and $BL_2$ of the adjacent bit line pairs through capacitive coupling.

FIG. 4 shows exemplary changes of bit line potentials in data reading. Shown in FIG. 4 are voltage waveforms in such case that "L" is read on a bit line BL and "L" is read on a bit line $\overline{BL}$ of an adjacent bit line pair.

Lowering in readout voltage on a bit line caused by capacitive coupling noise with respect to an adjacent bit line pair is also described in IBM Journal of Research and Development, Vol. 29, No. 3, May 1985, pp. 277–288 by Peter E. Cottrel et al. This literature shows that the readout voltage is reduced in the ratio of $$1 - \frac{KC_3}{(C_1 + C_2 + C_3)}$$

(K: proportional constant) to 1.

When a semiconductor memory device is increased in storage capacitance and the memory size is decreased, the bit line pitch is also reduced. In this case, the interval between adjacent bit line pairs is also reduced and the capacitance $C_3$ between the bit line pairs is increased, whereby the second term in the right side of the expression (4) is increased. Namely, influence by potentials in bit lines of adjacent bit line pairs is increased, whereby readout voltage on the bit lines may be extremely damaged and potential difference $\Delta V_S$ on the bit line pair may be reduced. Thus, the sense amplifier SA cannot correctly detect and amplify the potential difference on the bit line pair, whereby the readout margin is lowered and the soft error rate is deteriorated, leading to a malfunction.

Since the conventional dynamic type semiconductor memory device is in the aforementioned structure, readout voltage difference is reduced by capacitive coupling noises between adjacent bit line pairs as the semiconductor memory device is implemented with higher density of integration and capacitance between adjacent bit lines is increased, whereby the soft error rate is deteriorated and the readout margin is lowered, leading to a malfunction.

Japanese Patent Laying-Open Gazette No. 60-254489 described structure of reducing noise components caused by capacitive coupling between adjacent bit line pairs. In this prior art example, two bit lines forming a bit line pair are intersected with alternate bit line pairs so that the two bit lines are alternately adjacent to bit lines of adjacent bit line pairs. However, although noise components caused by capacitive coupling can be reduced with respect to bit line pairs having intersections since such intersections of the bit lines are provided with respect to alternate bit line pairs, noises caused by capacitive coupling cannot be reduced with respect to bit line pairs provided with no such intersections. Namely, no consideration is made on reduction of noises in the bit line pairs provided with no intersections.

Japanese Patent Application No. 62-51096 describes a memory device formed by alternately arranged bit line pairs intersected in even portions and bit line pairs intersected in odd portions. Although this prior art example shows a memory device in which the bit lines are precharged at the $V_{CC}$ level, no consideration is made on presence of dummy cells. Further, no consideration is made on unbalanced capacitance distribution in a pair of bit lines caused by an intersection and increase in bit line length caused by provision of such intersections.

SUMMARY OF THE INVENTION

An object of the present invention is to provide a semiconductor memory device which can eliminate influence exerted on readout voltage by capacitive coupling noises caused by capacitance between bit line pairs to completely prevent lowering of readout voltage amplitude.

Another object of the present invention is to provide a semiconductor memory device including bit line pairs having cross points, which can always connect dummy cells for providing a reference voltage to a bit line being paired with a bit line to which selected memory cells are connected.

Still another object of the present invention is to provide a semiconductor memory device including bit line pairs having cross points, which can prevent increase in bit line length.

In the semiconductor memory device according to the present invention, each bit line pair has a cross point in at least one portion so as to equalize values of capacitance formed by bit lines of bit line pairs and those of adjacent bit line pairs.

Such cross points are preferably suitably provided in points for equally dividing the bit line pairs into 4N (N: integer) in the longitudinal direction.

Further, such cross points are preferably provided in a restore circuit for stepping up a higher potential one of each bit line pair and/or a sense amplifier circuit for detecting and amplifying a potential difference on the bit line pair.

A memory device of a dummy cell system includes bit line pairs having cross points, and a dummy word line decoder for connecting dummy cells to a reference bit line paired with a bit line to which memory cells are connected by a selected word line.

In the aforementioned structure, the respective bit line pairs have cross points in appropriate positions so that capacitive coupling noises applied to the bit lines of the bit line pairs from those of adjacent bit line pairs respectively can be absolutely equalized, whereby lowering of a readout voltage difference appearing on the bit line pairs in information reading can be prevented and the readout margin can be improved.

Further, the bit line length is not increased since the cross points are provided in the sense amplifier circuit parts or the restore circuit parts.

Further, since the dummy word line for selecting dummy cells is selected in correspondence to the selected word line by the dummy cell decoder, the dummy cells are reliably connected to the reference bit line and no malfunction is caused in the memory device.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
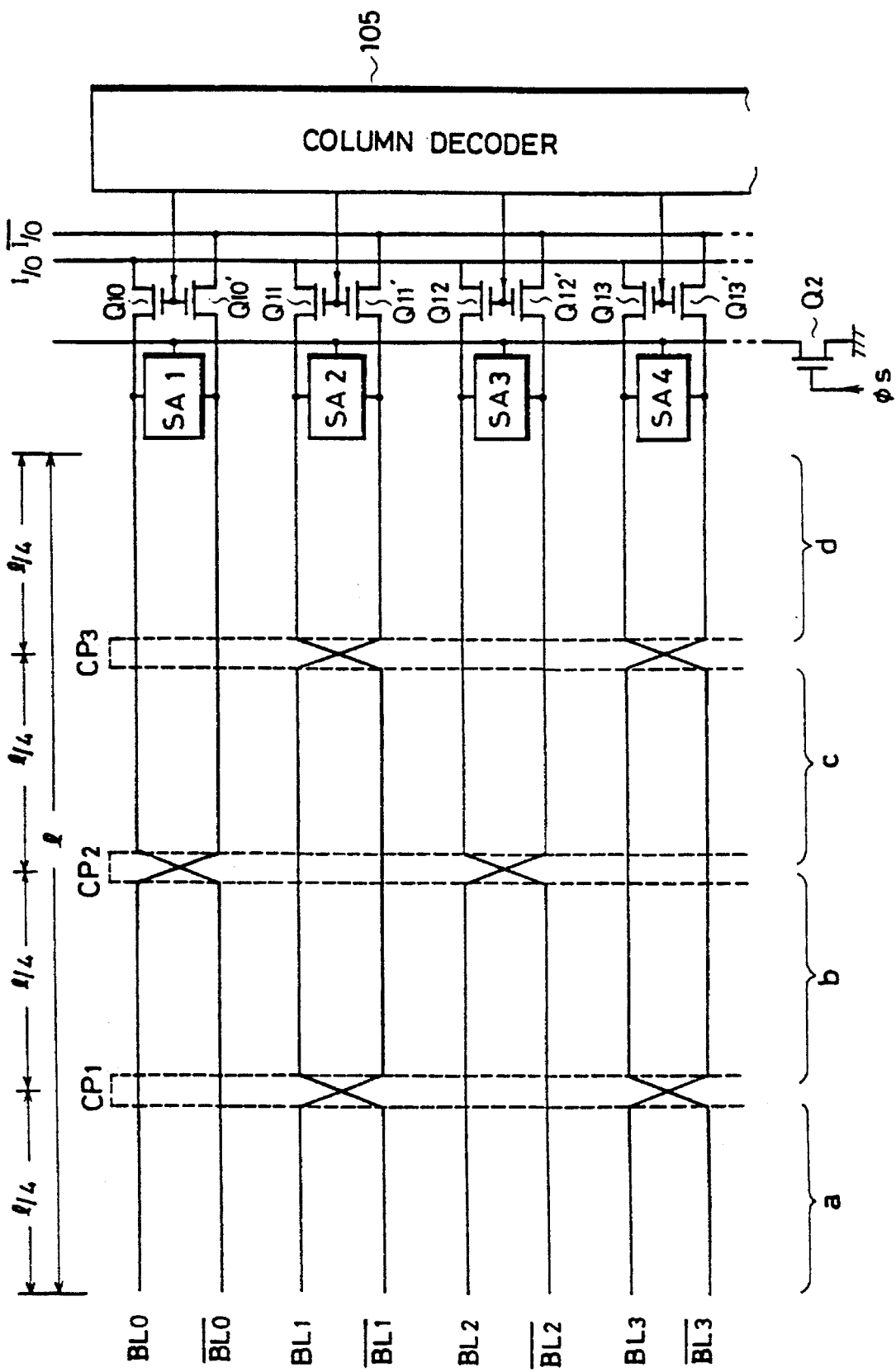
FIG. 5 shows the structure of a bit line part of a semiconductor memory device according to an embodiment of the present invention.

FIG. 5 shows the structure of bit lines of a semiconductor memory device according to an embodiment of the present invention.

Referring to FIG. 5, illustrated are four bit line pairs $BL_0$ and $\overline{BL_0}$, $BL_1$ and $\overline{BL_1}$, $BL_2$ and $\overline{BL_2}$ and $BL_3$ and $\overline{BL_3}$. Symbol l represents the length of each bit line. Each bit line is quarterly divided into blocks a, b, c and d by dividing points $CP_1$, $CP_2$ and $CP_3$. The paired bit lines cross with each other at the dividing points $CP_1$ to $CP_3$ in the following manner:

(1) The paired bit lines $BL_0$ and $\overline{BL_0}$ cross with each other at the even numbered dividing point $CP_2$.

(2) The paired bit lines $BL_1$ and $\overline{BL_1}$ cross with each other at the odd numbered dividing points $CP_1$ and $CP_3$.

(3) The paired bit lines $BL_2$ and $\overline{BL_2}$ cross with each other at the dividing point $CP_2$.

(4) The paired bit lines $BL_3$ and $\overline{BL_3}$ cross with each other at the dividing points $CP_1$ and $CP_3$.

Namely, alternately arranged are paired bit lines crossing at the dividing point $CP_2$ and those crossing at the dividing points $CP_1$ and $CP_3$. In other words, odd numbered bit line pairs cross at the dividing points $CP_1$ and $CP_3$ and even numbered bit line pairs cross at the dividing point $CP_2$ in view of the paired bit lines $BL_0$ and $\overline{BL_0}$.

The bit line pairs are provided with sense amplifiers $SA_1$ to $SA_4$ for detecting and amplifying a potential difference on the bit line pairs. Transfer gates $Q_{10}$ and $Q_{10}'$, $Q_{11}$ and $Q_{11}'$, $Q_{12}$ and $Q_{12}'$ and $Q_{13}$ and $Q_{13}'$ are provided in order to connect a pair of bit lines to data input/output lines I/O and $\overline{I/O}$ in response to output from a column decoder 105.

The sense amplifiers $SA_1$ to $SA_4$ are activated in response to a sense amplifier activating signal $\phi_S$ to detect and amplify the potential difference on the bit line pairs.

Figure 3:
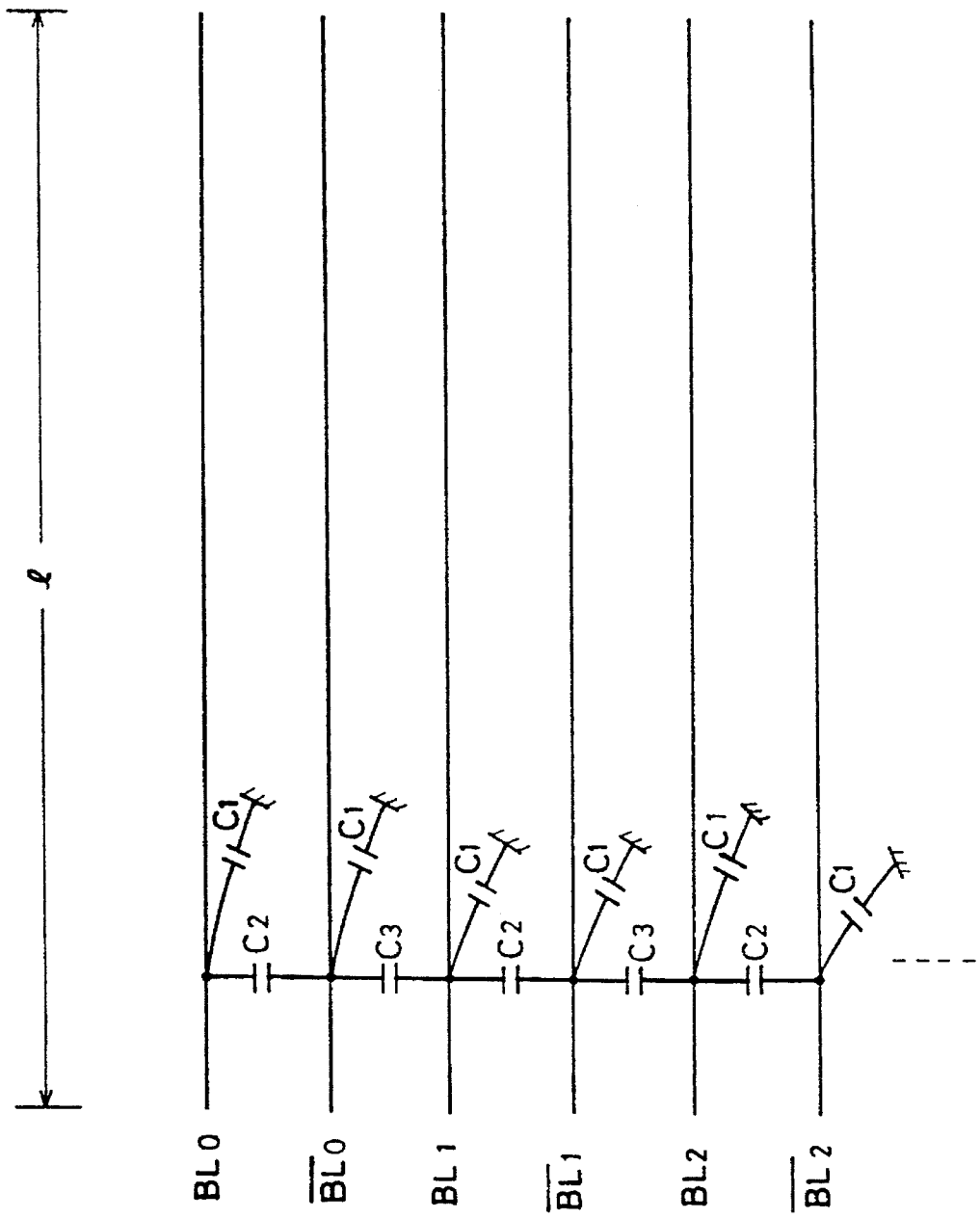
FIG. 3 conceptually shows capacitance incident to each bit line.

Assuming that the bit lines have the capacitance as shown in FIG. 3, capacitive coupling noises applied to the respective bit lines from adjacent bit line pairs in signal reading are expressed as follows, in consideration similar to the aforementioned case of the prior art:

(1) The bit line $BL_1$ is adjacent to the bit lines $\overline{BL_0}$, $BL_2$, $\overline{BL_2}$ and $BL_0$ in the blocks a, b, c and d respectively. On the other hand, the bit line $\overline{BL_1}$ is adjacent to the bit lines $BL_2$, $\overline{BL_0}$, $BL_0$ and $\overline{BL_2}$ respectively. With employment of $\alpha$ and $\gamma$ in the expression (4), capacitive coupling noises $\Delta V(BL_1)'$ and $\Delta V(\overline{BL_1})'$ applied to the bit lines $BL_1$ and $\overline{BL_1}$ are as follows:

$$\Delta V(\overline{BL_1})' = \frac{1}{4} \cdot \frac{\gamma}{1+\alpha} (\Delta V(\overline{BL_0}) + \Delta V(BL_2) + \Delta V(\overline{BL_2}) + \Delta V(BL_0))$$
$$\quad\quad\quad\quad\quad\quad\quad\quad\quad\quad\quad a\quad\quad b\quad\quad c\quad\quad d$$

$$\Delta V(\overline{BL_1})' = \frac{1}{4} \cdot \frac{\gamma}{1+\alpha} (\Delta V(BL_2) + \Delta V(\overline{BL_0}) + \Delta V(BL_0) + \Delta V(BL_2))$$

As obvious from the above expressions, $\Delta V(BL_1)'$ is equal to $\Delta V(\overline{BL_1})'$.

(2) The bit line $BL_2$ is adjacent to the bit lines $\overline{BL_1}$, $BL_1$, $BL_3$ and the bit lines $\overline{BL_2}$ is adjacent to the bit lines $BL_3$, $\overline{BL_3}$, $BL_1$ and $\overline{BL_1}$ in the blocks a, b, c and d respectively. Therefore, capacitive coupling noises $\Delta V(BL_2)'$ and $\Delta V(\overline{BL_2})'$ applied to the bit lines $BL_2$ and $\overline{BL_2}$ in signal reading are as follows:

$$\Delta V(BL_2)' = \frac{1}{4} \cdot \frac{\gamma}{1+\alpha} (\Delta V(\overline{BL_1}) + \Delta V(BL_1) + \Delta V(\overline{BL_3}) + \Delta V(BL_3))$$
$$\quad\quad\quad\quad\quad\quad\quad\quad\quad\quad\quad a\quad\quad b\quad\quad c\quad\quad d$$

$$V(\overline{BL_2})' = \frac{1}{4} \cdot \frac{\gamma}{1+\alpha} (\Delta V(BL_3) + \Delta V(\overline{BL_3}) + \Delta V(BL_1) + \Delta V(\overline{BL_1}))$$

As obvious from the above expressions, $\Delta V(BL_2)'$ is equal to $\Delta V(\overline{BL_2})'$.

Thereafter in a similar manner, capacitive coupling noises applied to each of paired bit lines from adjacent bit lines are absolutely equal to each other with respect to all of the bit line pairs.

(3) Also in case where the bit lines $BL_0$ and $\overline{BL_0}$ are located at a memory array end, capacitive coupling noises $\Delta V(BL0)'$ and $\Delta V(\overline{BL_0})'$ applied to the bit lines $BL_0$ and $\overline{BL_0}$ from adjacent bit lines are as follows:

$$\Delta V(BL_0)' = \frac{1}{4} \cdot \frac{\gamma}{1+\alpha} (\Delta V(\overline{BL_1}) + \Delta V(BL_1))$$
$$\quad\quad\quad\quad\quad\quad\quad\quad\quad\quad c\quad\quad\quad d$$

$$\Delta V(\overline{BL_0})' = \frac{1}{4} \cdot \frac{\gamma}{1+\alpha} (\Delta V(BL_1) + \Delta V(\overline{BL_1}))$$
$$\quad\quad\quad\quad\quad\quad\quad\quad\quad\quad a\quad\quad\quad b$$

It is obvious that $\Delta V(BL_0)$ is equal to $\Delta V(\overline{BL_0})$.

Figure 4:
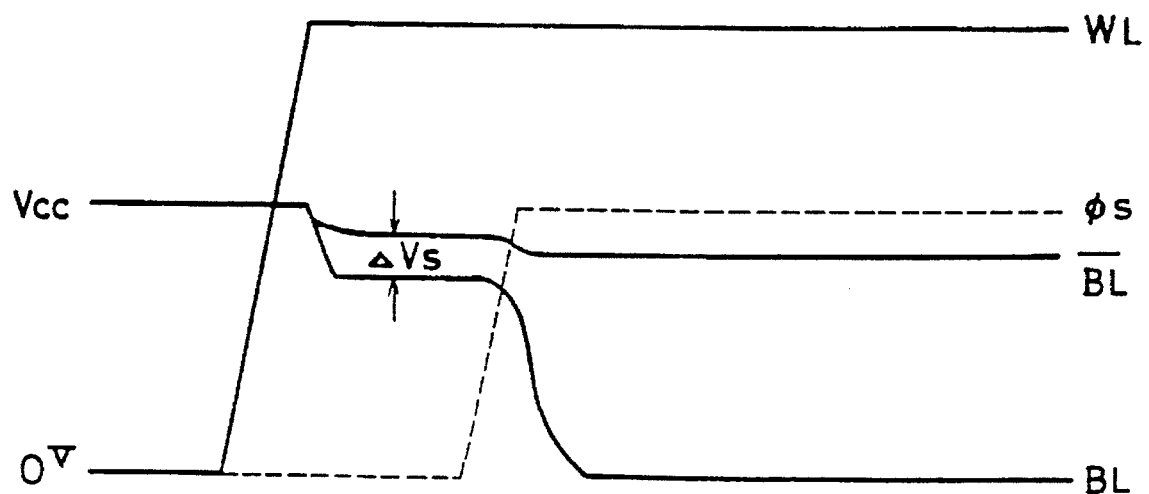
FIG. 4 is a waveform diagram showing potential changes in a bit line pair in data reading.

In the embodiment as hereinabove described, capacitive coupling noises applied to the respective paired bit lines from adjacent bit line pairs in signal reading are absolutely equal to each other, whereby influence by the second term in the right side of the expression (4) can be completely eliminated. Namely, the readout voltage difference $\Delta V_S$ as shown in FIG. 4 can be increased as compared with the prior art. Thus, lowering of readout voltage difference caused by capacitive coupling noises from adjacent bit line pairs can be absolutely eliminated, thereby to enlarge the readout margin and improve the soft error rate.

Figure 6:
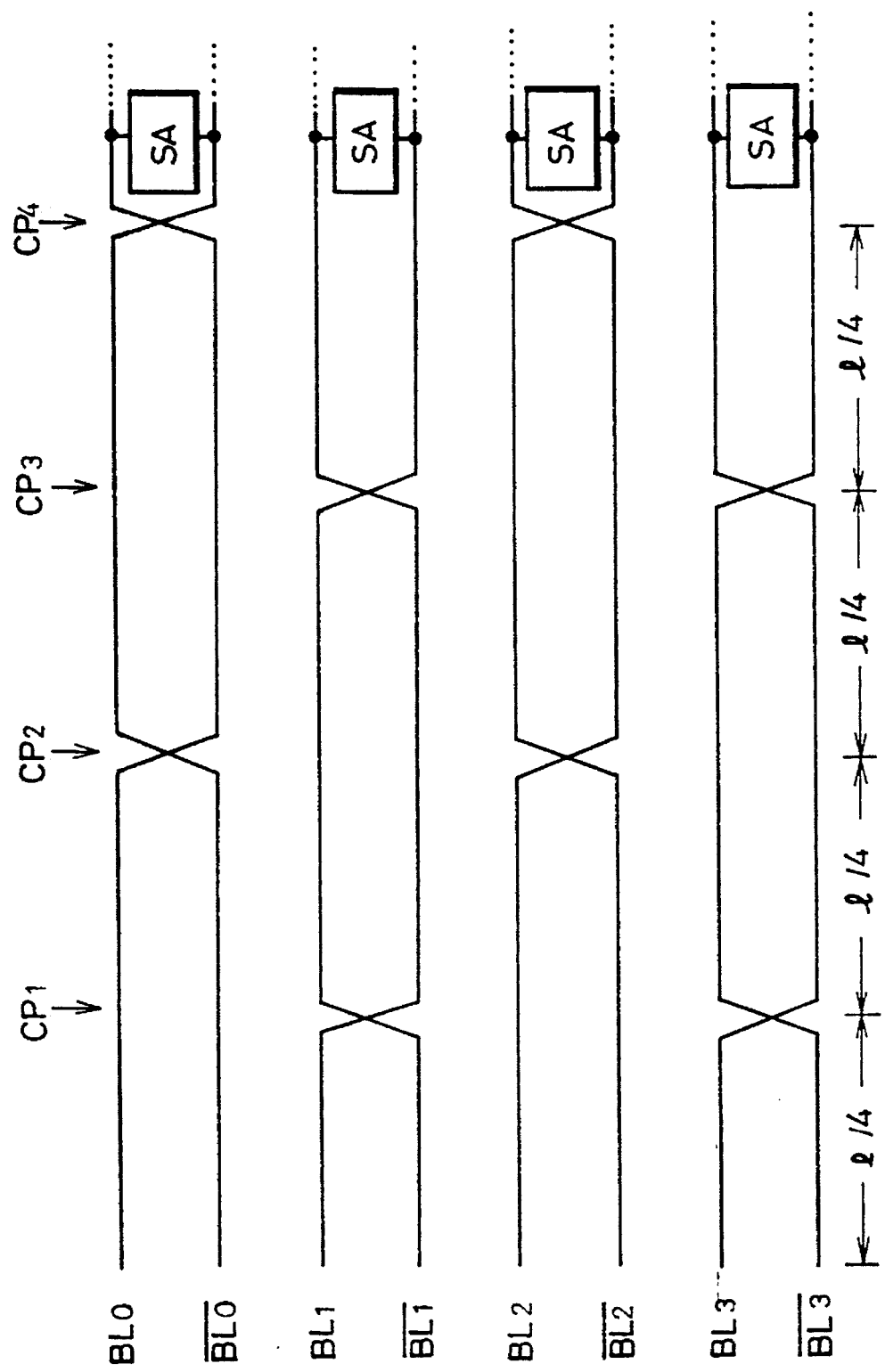
FIG. 6 shows the structure of a bit line part according to another embodiment of the present invention.

FIG. 6 shows the structure of bit lines according to a second embodiment of the present invention.

Referring to FIG. 6, cross points are further added at a bit line end point $CP_4$ (end point close to sense amplifiers) to odd numbered bit line pairs ($BL_0$ and $\overline{BL_0}$, $BL_2$ and $\overline{BL_2}$, ...), dissimilarly to the bit line structure as shown in FIG. 5.

It is impossible to lay out bit line cross points at dividing points $CP_1$, $CP_2$ and $CP_3$ such that stray capacitance distribution is completely symmetrical with respect to each pair of bit lines. In the above discussion, calculation is performed on the assumption that capacitance incident to each bit line is uniformly distributed over the longitudinal direction of the bit line. When there is only one bit line cross point which is not symmetrical in configuration, distribution of stray capacitance of the bit line pair may be unbalanced.

With respect to the even numbered bit line pairs ($BL_1$ and $\overline{BL_1}$, $BL_3$ and $\overline{BL_3}$, . . . ) in the embodiment as shown in FIG. 5, it is possible to implement balanced capacitance distribution for the entire bit line pairs since the cross points are provided in two portions of the dividing points $CP_1$ and $CP_3$. Assuming that the bit lines are of aluminum (Al) layers and interconnection layers intersectable with the same are of polysilicon layers, for example, unbalanced distribution of stray capacitance in the bit line pair can be avoided by preparing the bit lines $BL_1$ and $\overline{BL_1}$ by an Al layer and a polysilicon layer respectively at the dividing point $CP_1$ and by preparing the bit lines $BL_1$ and $\overline{BL_1}$ by a polysilicon layer and an Al layer respectively at the dividing point $CP_3$.

The embodiment as shown in FIG. 6 is adapted to implement the effect similar to that of the aforementioned discussion, by providing cross points serving as dummy points in the odd numbered bit line pairs ($BL_0$ and $\overline{BL_0}$, $BL_2$ and $\overline{BL_2}$, . . . ) at the end point $CP_4$. Thus, balanced capacitance distribution can be implemented with respect to all of the bit line pairs.

Although each of the bit lines is divided into four blocks of equal length in the above embodiment so that the paired bit lines cross at appropriate points, the number of such division may be an integral multiple of four such as eight or twelve, to attain an effect similar to that of the above embodiment.

Figure 7:
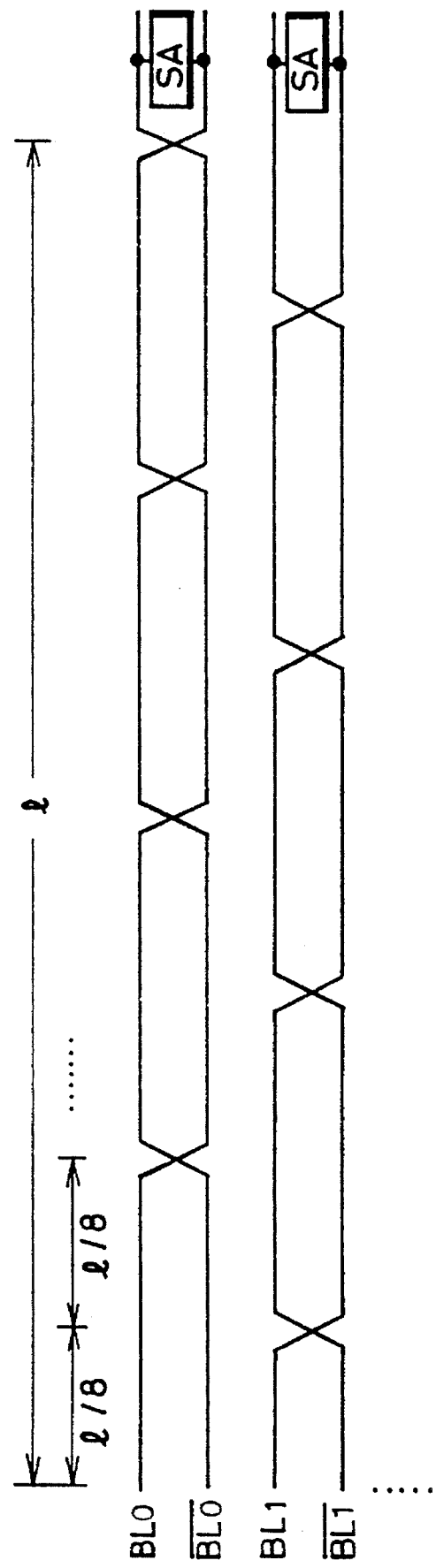
FIG. 7 shows the structure of a bit line part according to still another embodiment of the present invention.

FIG. 7 shows the structure of bit lines, which are equally divided into eight blocks. Referring to FIG. 7, the bit line structure as shown in FIG. 6 is repeated twice in the longitudinal direction of the bit lines, and it is obvious that an effect similar to that of the structure as shown in FIG. 6 can be attained by such structure.

Although the bit lines are precharged at the supply voltage level $V_{CC}$ in the aforementioned embodiment, the present invention is also applicable to the case of a bit line precharge level of ½ $V_{CC}$.

Figure 1:
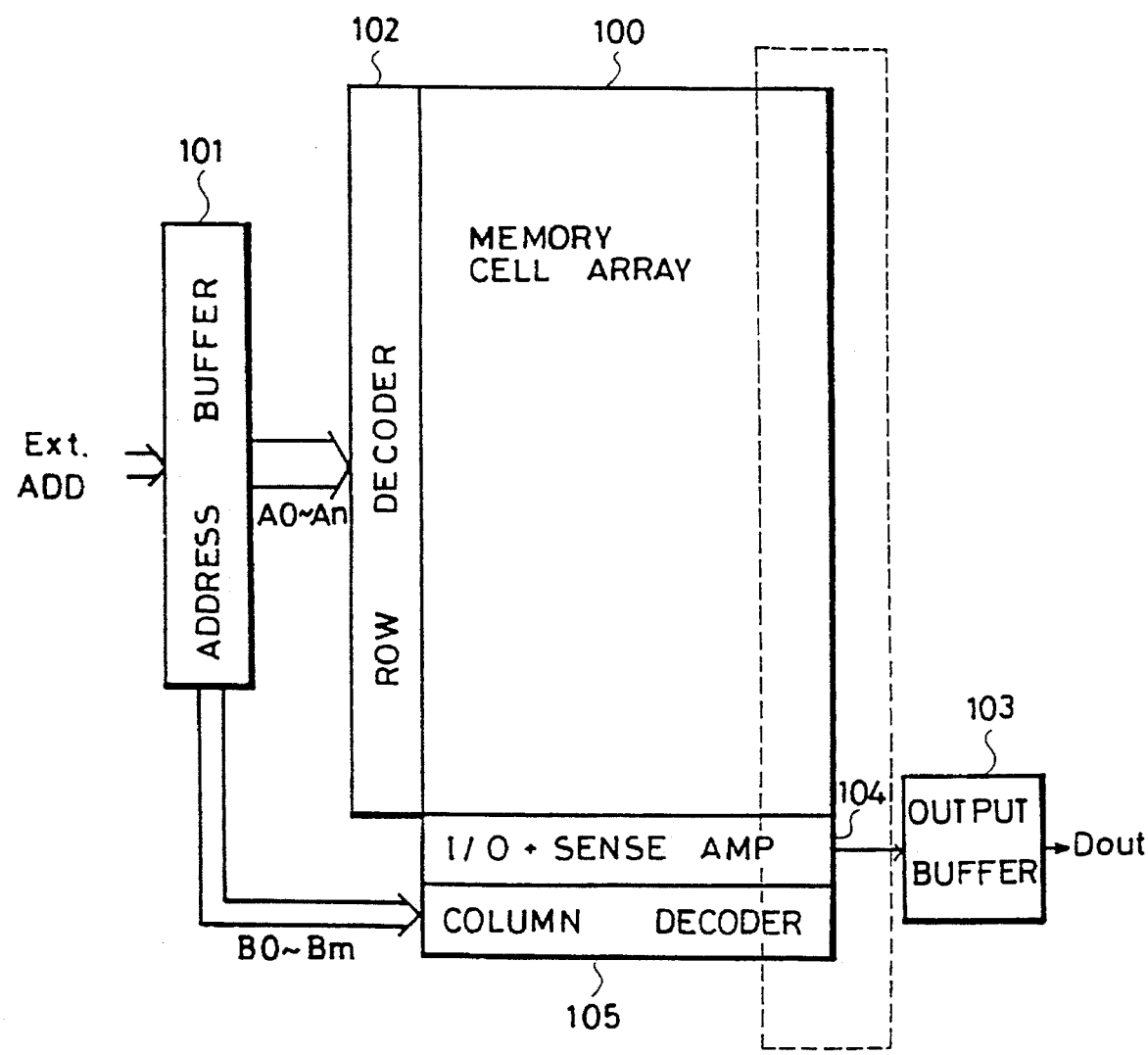
FIG. 1 schematically shows the entire structure of a generally employed basic semiconductor memory device.
Figure 2:
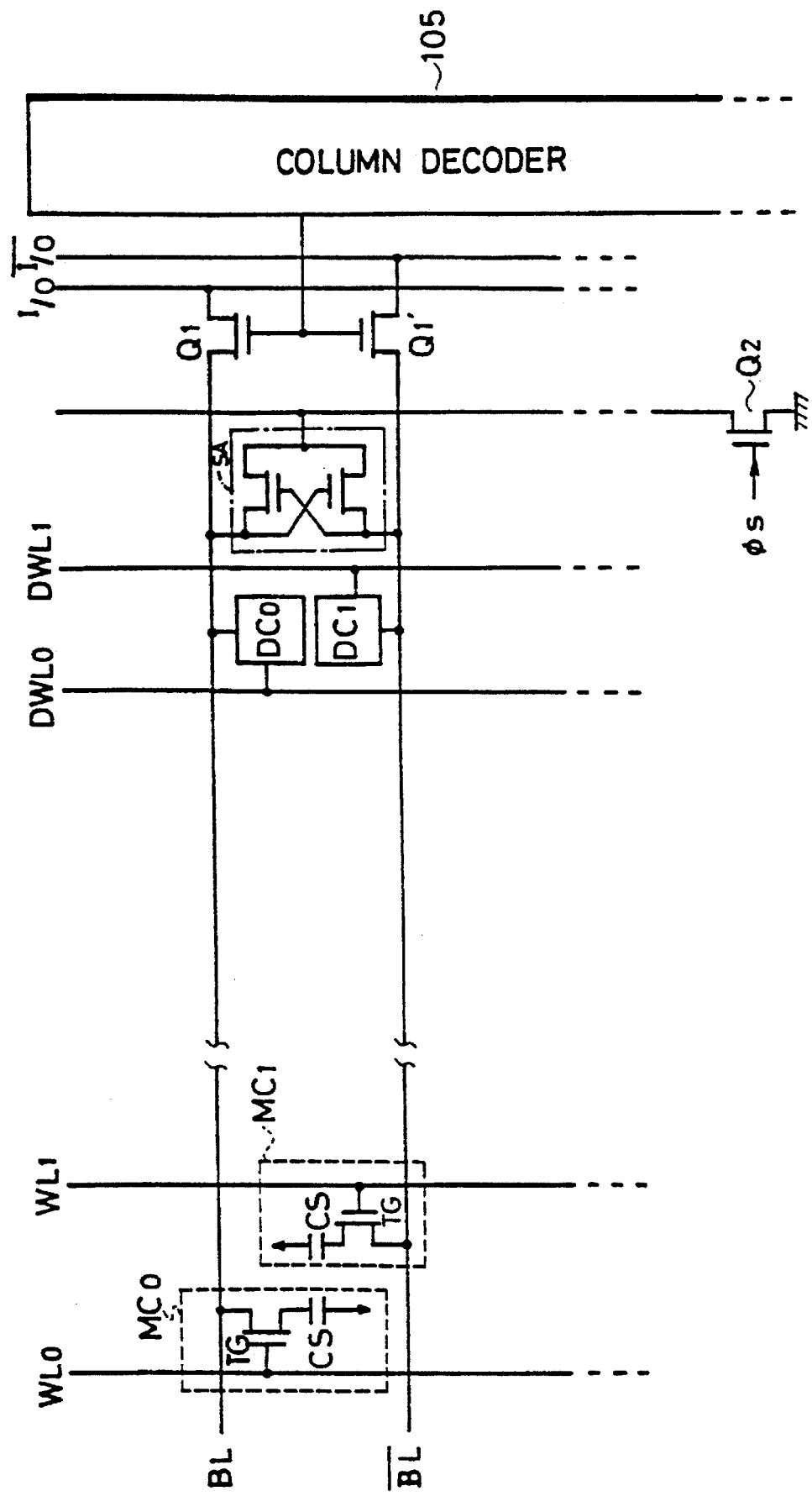
FIG. 2 shows the structure of a bit line part of the conventional semiconductor memory device.

A memory device of the aforementioned dummy cell system may malfunction when a conventional dummy word line selecting method is simply applied. Referring again to FIG. 2, the dummy word line $DWL_1$ is selected when the word line $WL_0$ is selected and the dummy word line $DWL_0$ is selected when the word line $WL_1$ is selected in the conventional dummy word line selecting method. In other words, the dummy word line $DWL_1$ is selected when an even numbered word line ($WL_0$, $WL_2$, . . . ) is selected, and the dummy word line $DWL_0$ is selected when an odd numbered word line (WL1, WL3, . . . ) is selected.

Figure 8:
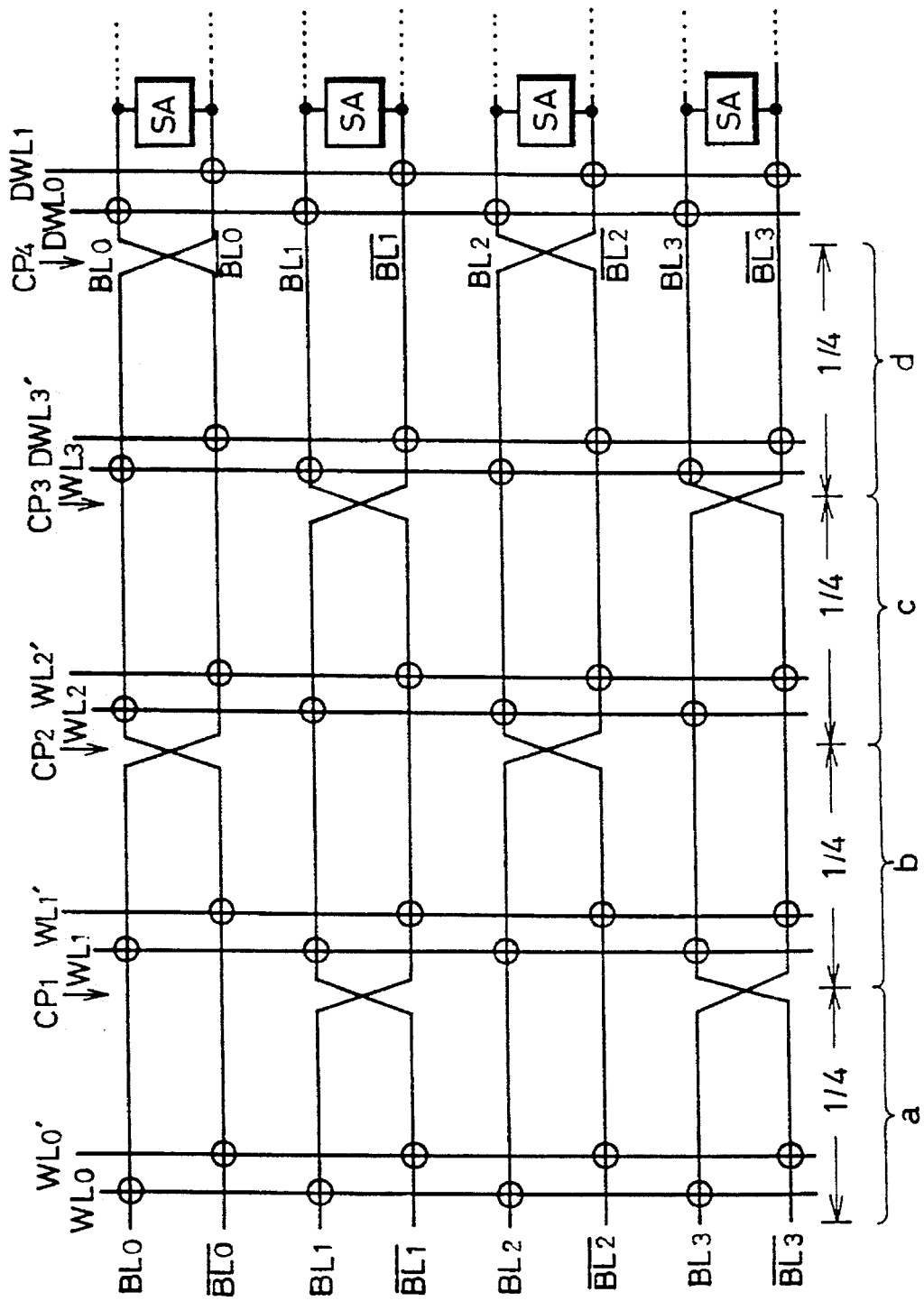
FIG. 8 is a diagram for illustrating a problem caused when the semiconductor memory device according to the present invention is applied to a conventional semiconductor memory device of a dummy cell system.

FIG. 8 shows the structure of the memory device as shown in FIG. 6, to which the conventional dummy cell system is applied. Referring to FIG. 8, circles in intersections between word lines ($WL_0$, $WL_0'$, $WL_1$, $WL_1'$, . . . ) and bit lines denote that memory cells are arranged. Further, circles in intersections between dummy word lines $DWL_0$ and $DWL_1$ and the bit lines indicate that dummy cells are arranged.

As shown in FIG. 8, the memory cells are alternately arranged such that the memory cells selected by the word line $WL_0$ are connected to bit lines $BL_0$, $BL_1$, $BL_2$, $BL_3$, . . . and the memory cells selected by the word line $WL_0'$ being adjacent to the word line $WL_0$ are connected to the bit lines $\overline{BL_0}$, $\overline{BL_1}$, $\overline{BL_2}$, $\overline{BL_3}$, . . . , for example. Each bit line pair is quarterly divided into four blocks a, b, c and d.

The dummy cells are arranged similarly to the memory cells such that the dummy cells selected by the dummy word line $DWL_0$ are connected to the bit lines $BL_0$, $BL_1$, $BL_2$, $BL_3$, . . . and the dummy cells selected by the dummy word line $DWL_1$ are connected to the bit lines $\overline{BL_0}$, $\overline{BL_1}$, $\overline{BL_2}$, $\overline{BL_3}$, . . . , for example.

Considering that it is necessary to connect the dummy cells to bit lines (reference side bit lines) opposite to those to which the memory cells are connected, with reference to FIG. 8, (1) the dummy word line $DWL_1$ may be selected when the word line $WL_0$ in the block a is selected and the dummy word line $DWL_0$ may be selected when the word line $WL_0'$ in the block a is selected.

(2) When the word line $WL_1$ or $WL_1'$ in the block b is selected, half the total bit line pairs are necessarily in nonconformance regardless of whether the dummy word line $DWL_0$ or $DWL_1$ is selected.

(3) The dummy word line $DWL_0$ may be selected when the word line $WL_2$ in the block c is selected and the dummy word line $DWL_1$ may be selected when the word line $WL_2'$ in the block c is selected, similarly to the case of (1).

(4) When the word line $WL_3$ or $WL_3'$ in the block d is selected, the situation is similar to the case of (2).

Thus, the conventional dummy cell system is not applicable to the case of such bit line pairs including cross points.

Figure 9:
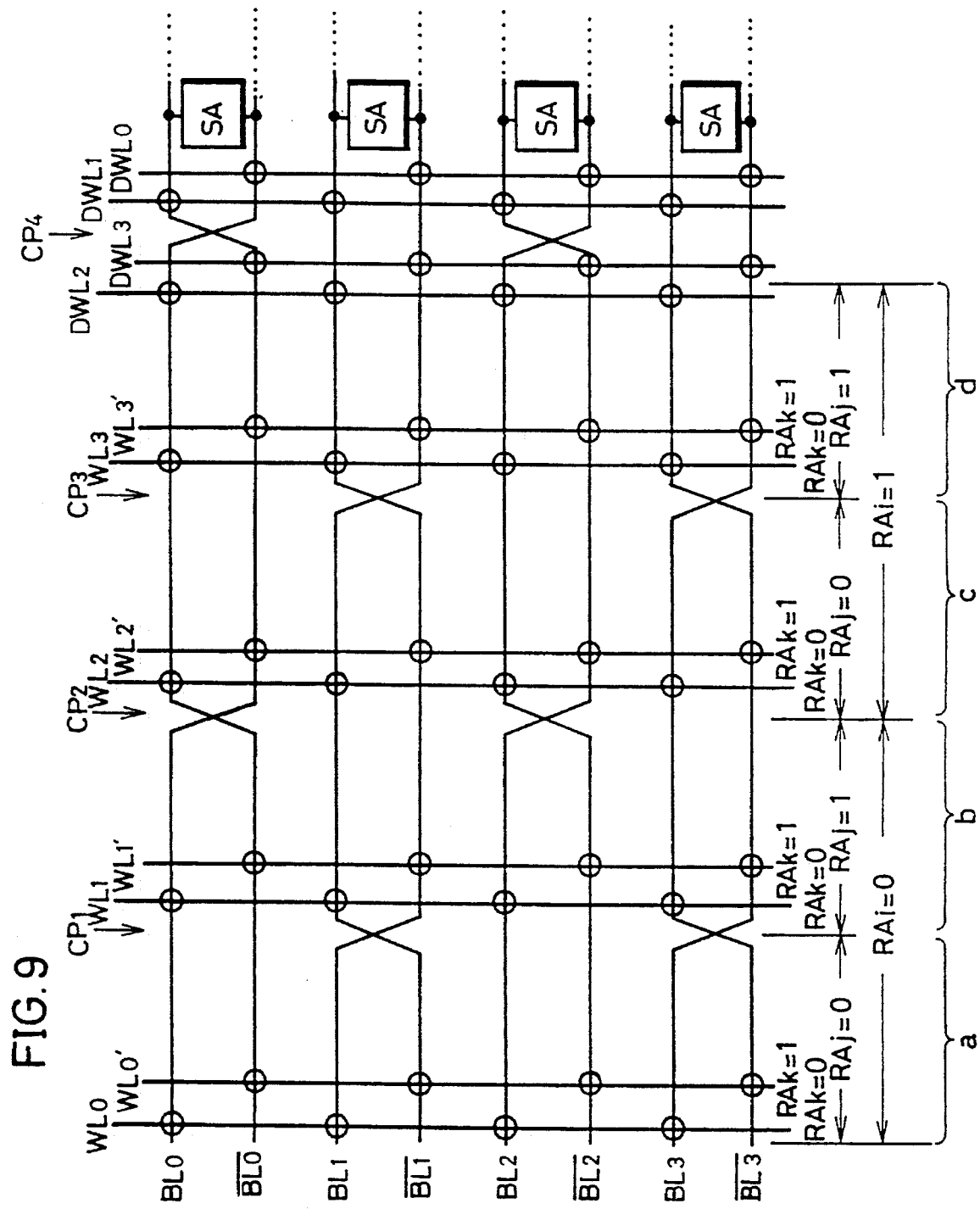
FIG. 9 shows an improved example of a dummy cell system semiconductor memory device according to the present invention.

Such a disadvantage can be overcome by structuring dummy word lines and a dummy word line selecting decoder in the following manner:

FIG. 9 illustrates an improved example of the semiconductor memory device according to the present invention.

The improved device as shown in FIG. 9 has two pairs of dummy word lines $DWL_0$, $DWL_1$, $DWL_2$ and $DWL_3$ on both sides of cross points $CP_4$ of bit line pairs, dissimilarly to the structure of FIG. 8. Each of the dummy word lines is provided with dummy cells (shown by circles in FIG. 9) at intersections with alternate bit lines. The dummy word lines $DWL_0$ and $DWL_3$ are provided with dummy cells in intersections with lower ones of the respective paired bit lines in the figure, while the dummy word lines $DWL_1$ and $DWL_2$ are provided with dummy cells in intersections with upper ones of the paired bit lines in the figure. One of the four dummy word lines $DWL_0$ to $DWL_3$ is selected in response to the block to which a selected word line belongs.

Respective blocks a to d of the bit line pairs are addressed by two-bit row addresses. Mapping by row addresses $RA_i$ and $RA_j$ (where $i \neq j$) is as follows:

block a: $RA_i = RA_j = 0$
block b: $RA_i = 0$, $RA_j = 1$
block c: $RA_i = 1$, $RA_j = 0$
block d: $RA_i = RA_j = 1$ Word lines $WL_0$, $WL_0'$, $WL_1$, $WL_1'$, . . . are mapped with row addresses $RA_k$ ($k \neq i$, $k \neq j$) as follows:

$WL_0$, $WL_1$, $WL_2$, $WL_3$, . . . : $RA_k = 0$
$WL_0'$, $WL_1'$, $WL_2'$, $WL_3'$, . . . : $RA_k = 1$

Namely, the word lines having memory cells in intersections with upper ones of the paired bit lines in FIG. 9 are addressed by $RA_k = 0$ and the word lines having memory cells in intersections with lower bit lines are addressed by $RA_k = 1$.

In the memory device of the structure as shown in FIG. 9, dummy cells can be always connected to reference bit lines (bit lines providing reference voltage in sensing operation) by selecting the dummy word lines $DWL_0$ to $DWL_3$ in response to the selected word line as follows:

(1) Within the block a:
when $WL_0$ is selected: $DWL_0$
when $WL_0'$ is selected: $DWL_1$ (2) Within the block b:
when $WL_1$ is selected: $DWL_2$
when $WL_1'$ is selected: $DWL_3$ (3) Within the block c:
when $WL_2$ is selected: $DWL_1$
when $WL_2'$ is selected: $DWL_0$ (4) Within the block d:
when $WL_3$ is selected: $DWL_3$
when $WL_3'$ is selected: $DWL_2$ Namely, the dummy word lines are selected as shown in the following Table 1 with respect to values of the aforementioned three-bit row addresses $RA_i$, $RA_j$ and $RA_k$:

TABLE 1

| Selected Word Line | Row Address | | | Selected Dummy Word Line |
|---|---|---|---|---|
| | $RA_i$ | $RA_j$ | $RA_k$ | |
| $WL_0$ | 0 | 0 | 0 | $DWL_0$ |
| $WL_0'$ | 0 | 0 | 1 | $DWL_1$ |
| $WL_1$ | 0 | 1 | 0 | $DWL_2$ |
| $WL_1'$ | 0 | 1 | 1 | $DWL_3$ |
| $WL_2$ | 1 | 0 | 0 | $DWL_1$ |
| $WL_2'$ | 1 | 0 | 1 | $DWL_0$ |
| $WL_3$ | 1 | 1 | 0 | $DWL_3$ |
| $WL_3'$ | 1 | 1 | 1 | $DWL_2$ |

Figure 10:
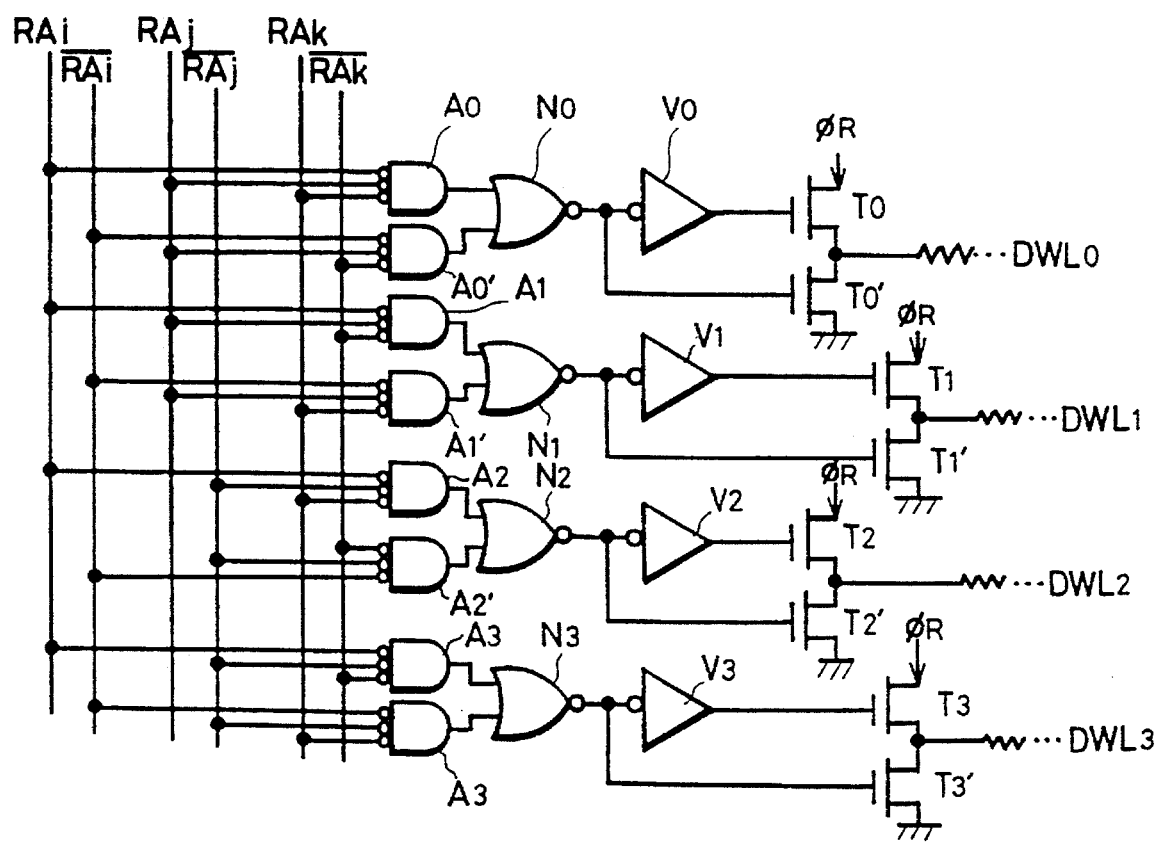
FIG. 10 shows an exemplary structure of a dummy word line decoder for selecting dummy word lines as shown in FIG. 9.

FIG. 10 shows exemplary structure of a dummy word line decoder.

With reference to FIG. 10, description is made on the structure and operation of the dummy word line decoder according to the present invention.

A dummy word line $DWL_0$ is provided with a negative logic AND gate (NOR gate) $A_0$ for receiving three-bit row addresses $RA_i$, $RA_j$ and $RA_k$, a negative logic AND gate $A_0'$ which receives three-bit row addresses $\overline{RA_i}$, $RA_j$ and $\overline{RA_k}$, a NOR gate $N_0$ which receives outputs from the negative logic AND gates $A_0$ and $A_0'$, an inverter $V_0$ which inverts an output from the NOR gate $N_0$, a MOS transistor $T_0$ which receives output from the inverter $V_0$ at its gate and a MOS transistor $T_0'$ which receives an output from the NOR gate $N_0$. The MOS transistors $T_0$ and $T_0'$ are connected in series, while one conducting terminal of the MOS transistor $T_0$ is supplied with a dummy word line driving signal $\phi_R$ and one conducting terminal of the MOS transistor $T_0'$ is connected to a reference (ground) potential. The junction between the MOS transistors $T_0$ and $T_0'$ is connected to a dummy word line $DWL_0$. The negative logic AND gates are positive logic NOR gates, which output "H" when all of input signals are "L". When the MOS transistor $T_0$ is in an ON state and the MOS transistor $T_0'$ is in an OFF state, the word line driving signal $\phi_R$ is transmitted to the dummy word line $DWL_0$, so that the dummy word line $DWL_0$ is selected. The word line driving signal $\phi_R$ is generated at the same time for driving the selected word line.

Similarly to the dummy word line $DWL_0$, the dummy word line $DWL_1$ is provided with a NOR gate $N_1$ which receives outputs from negative logic AND gates $A_1$ and $A_1'$, an inverter $V_1$ which receives an output from the NOR gate $N_1$, a MOS transistor $T_1$ which receives an output from the inverter $V_1$ at its gate for transmitting the word line driving signal $\phi_R$ to the dummy word line $DWL_1$ and a MOS transistor $T_1'$ which receives an output from the NOR gate $N_1$ at its gate for discharging the dummy word line $DWL_1$. The negative logic AND gate $A_1$ is supplied with row addresses $RA_i$, $RA_j$ and $\overline{RA_k}$. The negative logic AND gate $A_1'$ is supplied with row addresses $\overline{RA_i}$, $\overline{RA_j}$ and $\overline{RA_k}$.

The dummy word line $DWL_2$ is similarly provided with a NOR gate $N_2$ which receives outputs from negative logic AND gates $A_2$ and $A_2'$, an inverter $V_2$ which receives an output from the NOR gate $N_2$, a MOS transistor $T_2$ which transmits the word line driving signal $\phi_R$ to the dummy word line $DWL_2$ in response to an output from the inverter $V_2$ and an MOS transistor $T_2'$ which discharges the dummy word line $DWL_2$ in response to an output from the NOR gate $N_2$. The negative logic AND gate $A_2$ is supplied with row addresses $RA_i$, $\overline{RA_j}$ and $RA_k$ and the negative logic AND gate $A_2'$ is supplied with row addresses $RA_i$, $\overline{RA_j}$ and $RA_k$.

The dummy word line $DWL_3$ is similarly provided with a NOR gate $N_3$ which receives outputs from negative logic AND gates $A_3$ and $A_3'$, an inverter $V_3$ which receives an output from a NOR gate $N_3$, an MOS transistor $T_3$ which transmits the dummy word line driving signal $\phi_R$ to the dummy word line $DWL_3$ in response to an output from the inverter $V_3$ and an MOS transistor $T_3'$ which discharges the dummy word line $DWL_3$ in response to output from the NOR gate $N_3$. The negative logic AND gate $A_3$ is supplied with row addresses $RA_i$, $\overline{RA_j}$ and $\overline{RA_k}$, and the negative logic AND gate $A_3'$ is supplied with row addresses $\overline{RA_i}$, $RA_j$ and $RA_k$.

When an output of a negative logic AND gate is "H" in the aforementioned structure, the dummy word line driving signal $\phi_R$ is transmitted to a corresponding dummy word line. The output of the negative logic AND gate goes high when all of inputs are "L". Therefore, the decoder shown in FIG. 10 satisfies the relation between the selected word line and the selected dummy word line as shown in Table 1.

Thus, according to this embodiment, a dummy cell system applicable to a bit line system including cross points can be easily implemented by adding/arranging a set of dummy cells and dummy word lines (for two dummy word lines) which are absolutely similar to the conventional dummy cell system on both sides of the cross point $CP_4$.

In the above description, the word lines $WL_0$ and $WL_0'$ are representative of those included in the block a. This also applies to other word lines in the block a, as well as to other blocks. Selection of a single word line is performed by remaining row address.

The dummy word lines are not necessarily arranged in the positions of the above embodiment, but may be located on both sides of other cross point.

Although the aforementioned embodiment is applied to the device as shown in FIG. 6, the present invention is also applicable to other devices such as those shown in FIGS. 5 and 7.

Figure 11:
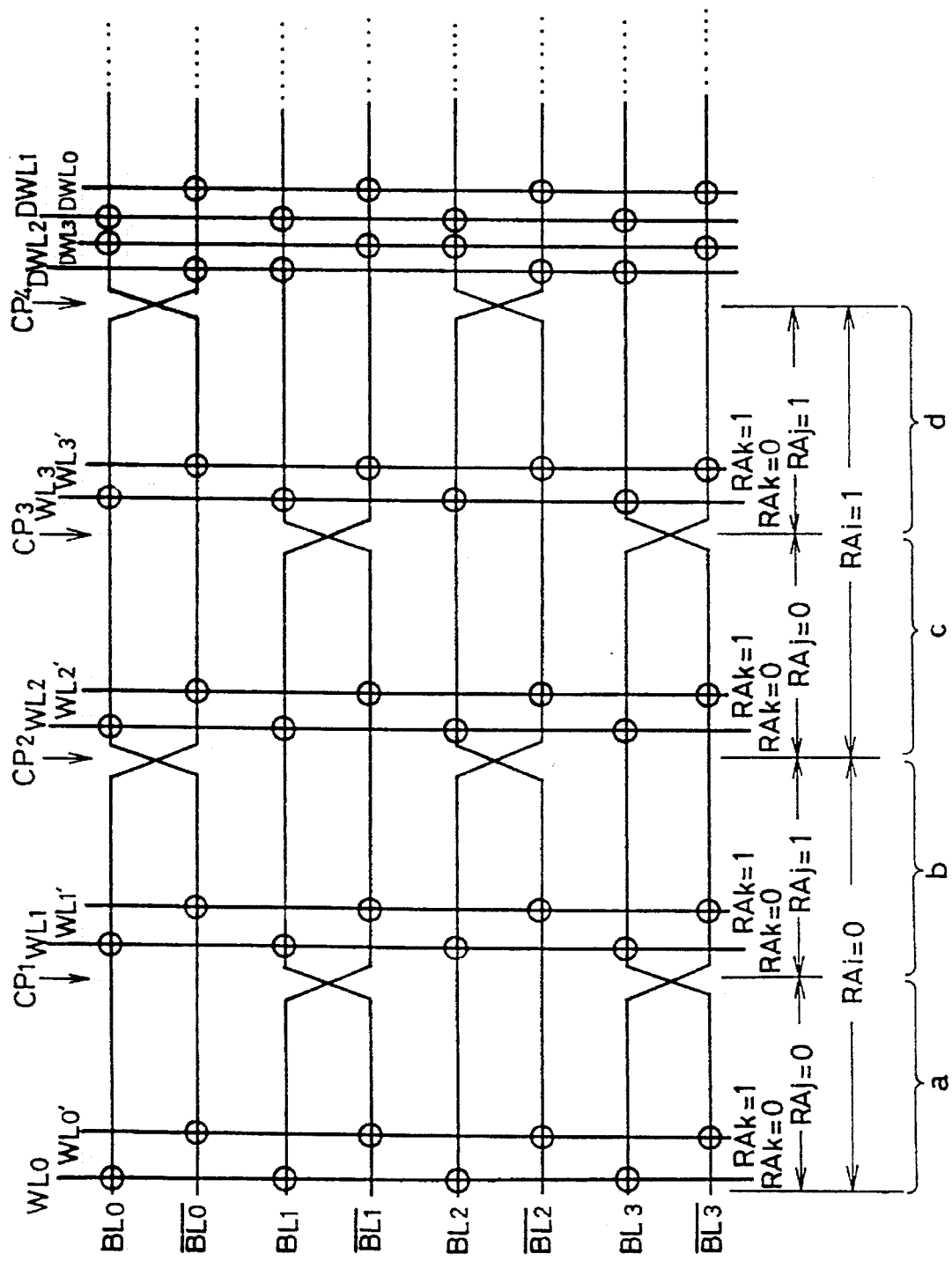
FIG. 11 shows another improved example of a dummy cell system semiconductor memory device according to the present invention.

FIG. 11 shows a semiconductor memory device according to a second improved example of the present invention. In this case, dummy cells are arranged continuously with respect to every third adjacent pair of bit lines for crossing bit lines with respect to dummy word lines $DWL_2$ and $DWL_3$ and in a portion per bit line pair.

Consequently, two dummy cells are connected to each bit line. Thus, parasitic capacitance caused by capacitive coupling between a bit line and the dummy cells can be made identical in the respective bit lines, and capacitance distribution in a single bit line can be balanced. Arrangement of the dummy cells is thus modified with respect to parts of dummy word lines so that the dummy cell system can be implemented with no difficulty even if all of the four dummy word lines $DWL_0$ to $DWL_3$ are arranged on one side of a cross point. In this case, a decoder for the dummy word lines $DWL_0$ to $DWL_3$ may be absolutely identical to that shown in FIG. 10.

The aforementioned example is adapted to improve a memory device of the dummy cell system. Description is now made on another improved example which can be applied to a memory device of, e.g., a ½ $V_{CC}$ precharge system having no dummy cell.

As hereinabove described, cross points are provided in the respective bit line pairs and connection of a bit line in the cross points is performed by alternately employing Al layers and polysilicon layers to uniformalize stray capacitance distribution in the respective bit line pairs in the present invention. In this case, however, the bit line length is excessively increased by provision of such cross points, whereby the area may be disadvantageously increased in view of layout.

Figure 12:
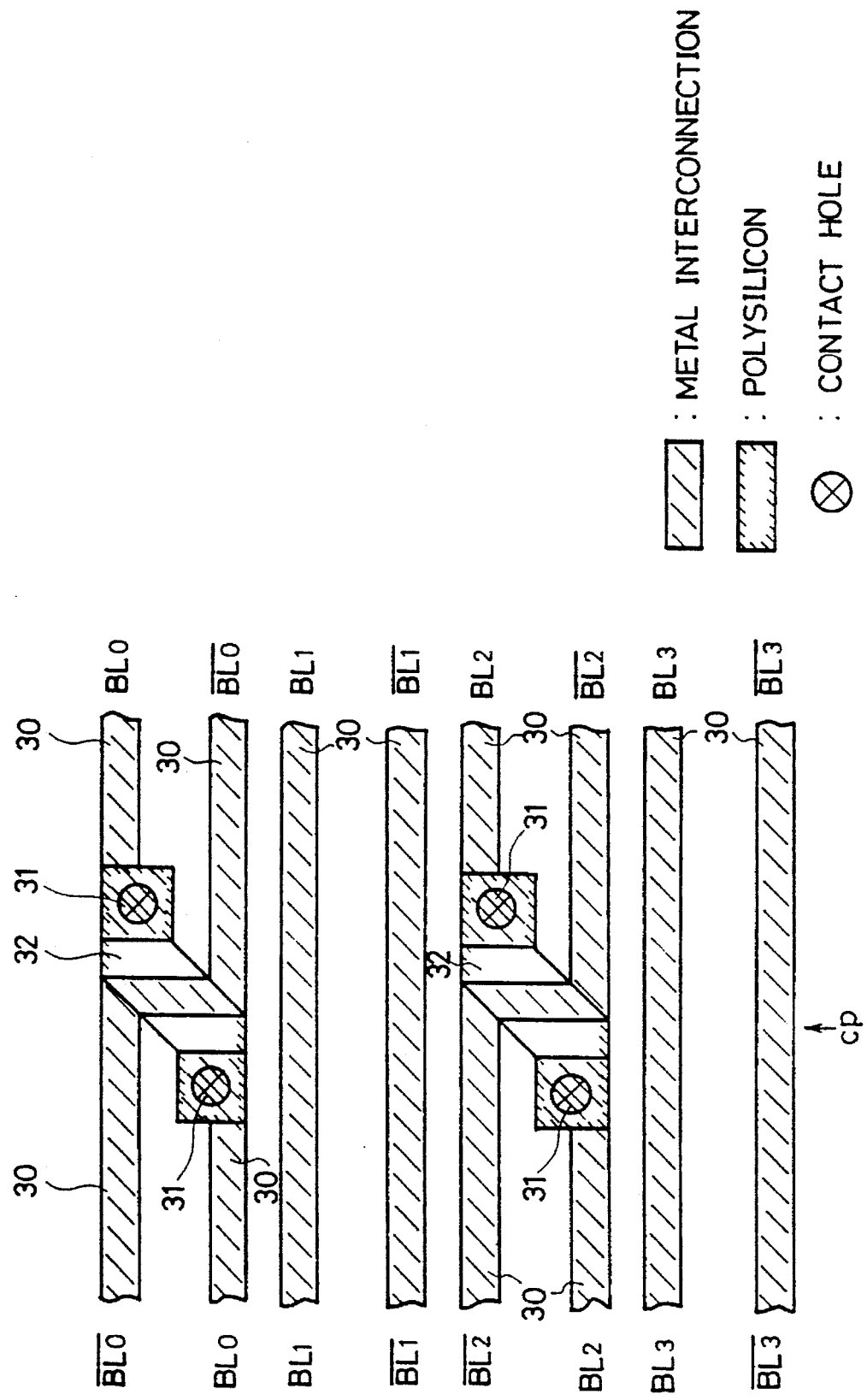
FIG. 12 illustrates the layout of cross points of bit line pairs according to the present invention.

FIG. 12 is a plan view showing the layout of cross points of paired bit lines. Referring to FIG. 12, the bit lines are formed by interconnection layers of low-resistance metal such as aluminum. Bit lines $BL_0$ and $BL_2$ are connected at cross points CP by polysilicon layers through contact holes 31. Memory cells cannot be connected in the cross points CP in this structure, and hence the bit line length is inevitably increased. Description is now made on technique of providing cross points without increasing bit line length. In order to illustrate a further improved example with no regard to presence/absence of dummy cells, the following description is made on case where each bit line pair is provided with a sense amplifier for detecting and amplifying a potential difference on the bit line pair and an active restore circuit for stepping up the higher potential bit line to supply voltage $V_{CC}$.

Figure 13:
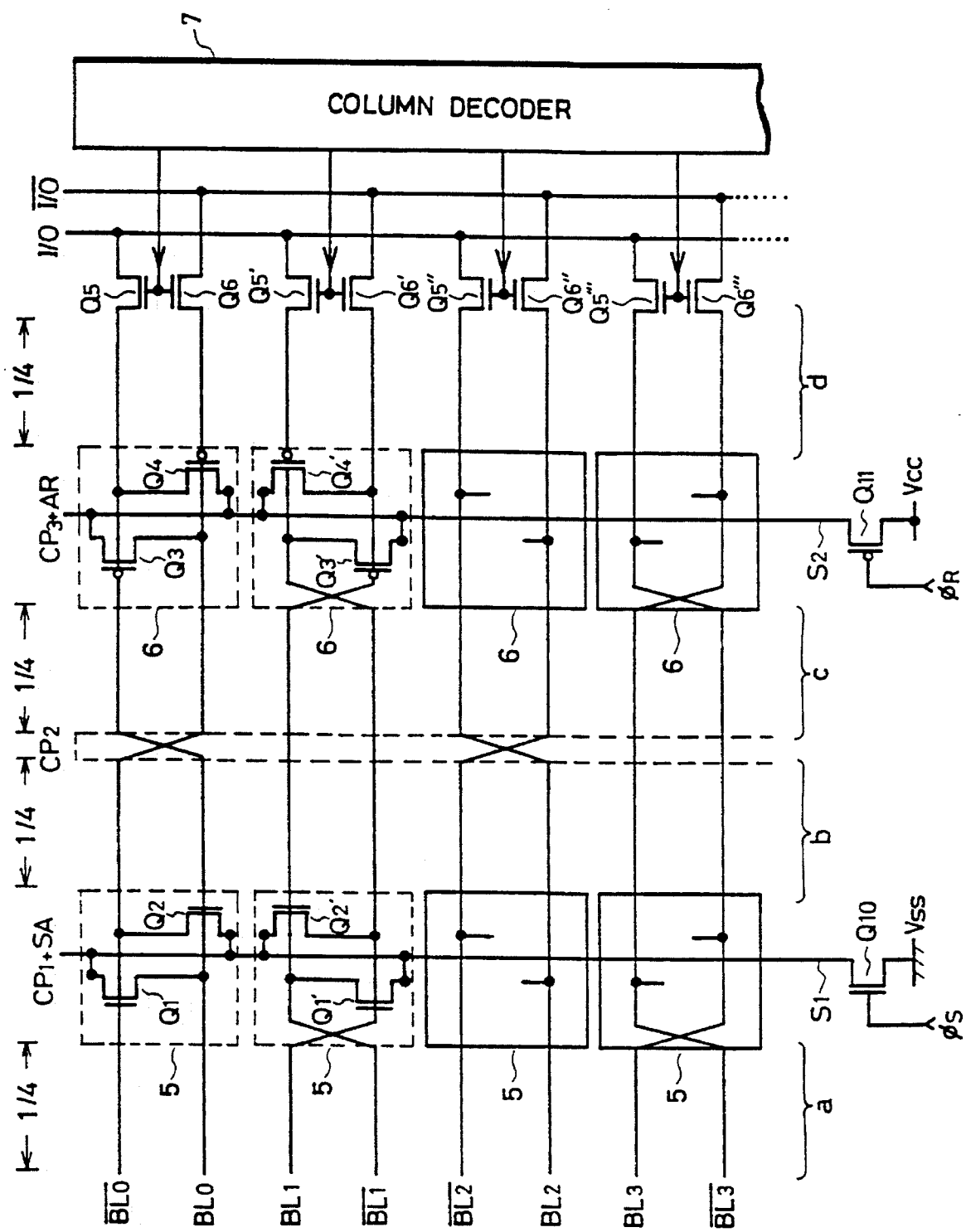
FIG. 13 shows an exemplary arrangement of bit line pairs, restore circuits and sense amplifiers in case of applying the present invention to a memory device having sense amplifiers and active restore circuits.

FIG. 13 shows the structure of the further improved example of the present invention.

Referring to FIG. 13, each of sense amplifiers 5 is formed by cross-coupled n-channel MOS transistors $Q_1$ and $Q_2$ ($Q_1$' and $Q_2$').

Sources of the n-channel MOS transistors $Q_1$ and $Q_2$ ($Q_1$' and $Q_2$') are connected to a common source line $S_1$. The common source line $S_1$ is connected to a ground potential $V_{SS}$ through an n-channel MOS transistor $Q_{10}$ which enters an ON state in response to a sense amplifier activating signal $\phi_S$. The sense amplifier 5 discharges the lower potential one of the bit lines to the ground potential in response to the sense amplifier activating signal $\phi_S$.

The active restore circuit 6 is formed by cross-coupled p-channel MOS transistors $Q_3$ and $Q_4$ ($Q_3$' and $Q_4$'). Sources of the p-channel MOS transistors $Q_3$ and $Q_4$ ($Q_3$' and $Q_4$') are connected to a signal line $S_2$. The signal line $S_2$ is connected to the supply potential $V_{CC}$ through a p-channel MOS transistor $Q_{11}$ which enters an ON state in response to a restore circuit activating signal $\overline{\phi_R}$. The active restore circuit 6 charges (re-charges) the higher potential one of the bit lines to the supply potential $V_{CC}$ in response to the restore circuit activating signal $\overline{\phi_R}$.

In the structure of FIG. 13, the bit line pairs are equally divided into four blocks a, b, c and d.

As shown in FIG. 13, the cross points $CP_1$ and the sense amplifiers 5 are provided between the blocks a and b, and cross points $CP_3$ and the active restore circuits 6 are provided between the blocks c and d.

Figure 14:
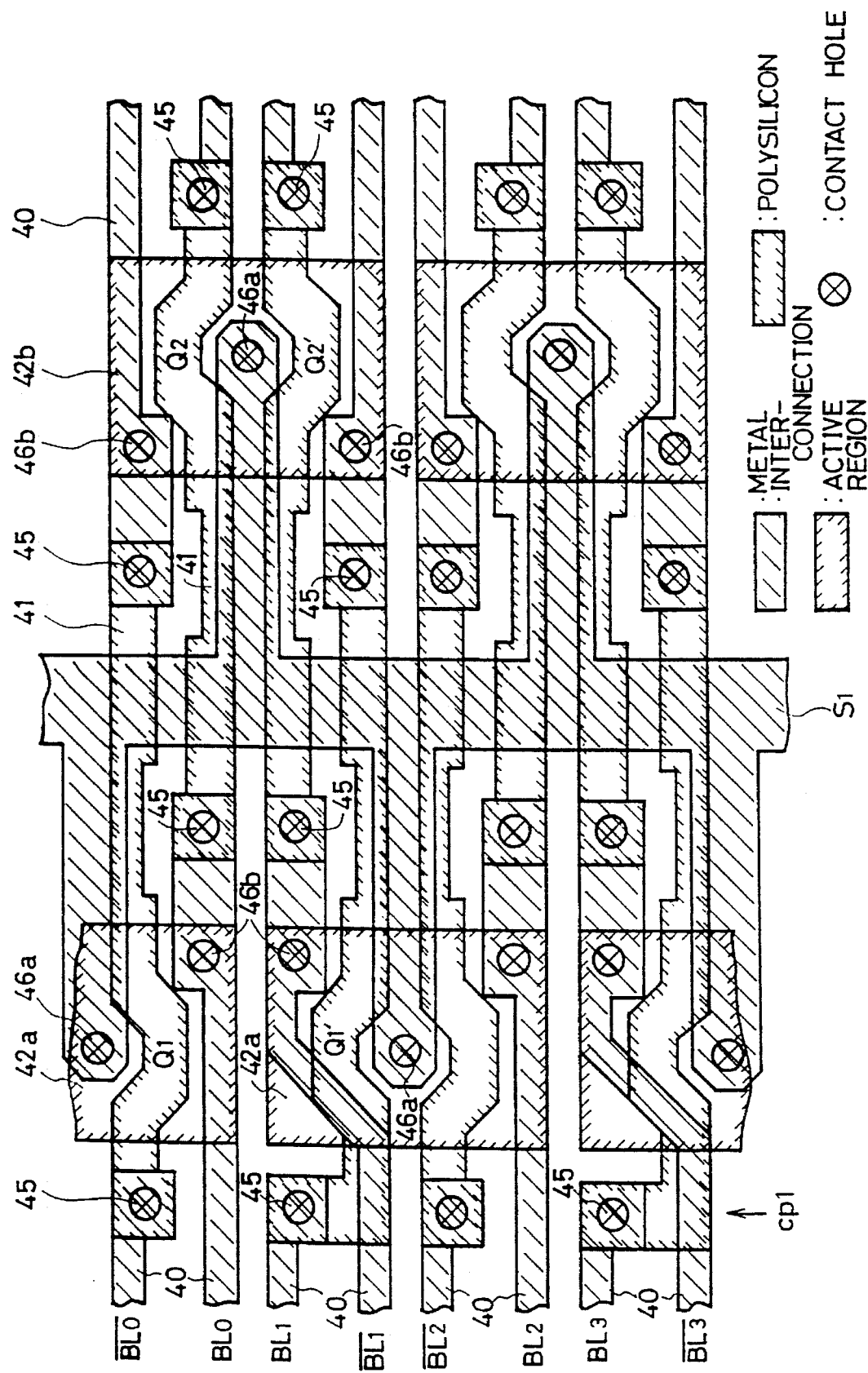
FIG. 14 shows still another improved example of the present invention with reference to the layout of a sense amplifier part provided with cross points.

FIG. 14 is a plan view showing an exemplary layout of the cross points $CP_1$ and the sense amplifiers.

As shown in FIG. 14, the gate of a transistor $Q_1$ formed in an active region 42a is formed by a polysilicon layer 41, which is connected to a metal interconnection layer 40 of aluminum etc. forming a bit line $\overline{BL_0}$ through a contact hole 45. The source of the transistor $Q_1$ is connected to a common source line $S_1$ through a contact hole 46a, and the drain thereof is connected to a bit line $BL_0$ through a contact hole 46b. The gate of a transistor $Q_2$ is formed by a polysilicon layer 41 and connected to the bit line $BL_0$ through a contact hole 45, while its source is connected to a signal line $S_2$ through a contact hole 46a and its drain is connected to the bit line $\overline{BL_0}$ through a contact hole 46b.

Description is now made on a pair of bit lines $BL_1$ and $\overline{BL_1}$ having a cross point $CP_1$. The bit line $BL_1$ (metal interconnection layer) is connected to the gate (polysilicon layer) of a transistor $Q_1$'. through a contact hole 45.

The source of the transistor $Q_1$' is connected to a signal line $S_2$ through a contact hole 46a, and its drain is connected to the bit line $\overline{BL_1}$ through a contact hole 46b. The gate (polysilicon layer 41) of a transistor $Q_2$' is connected to the bit line $\overline{BL_1}$ through a contact hole 45 and its source is connected to the signal line $S_1$ through a contact hole 46a, while its drain is connected to the bit line $BL_1$ through a contact hole 45b. The bit lines and signal lines are formed by metal interconnection layers, and the gates of the transistors are formed by polysilicon layers.

Figure 15:
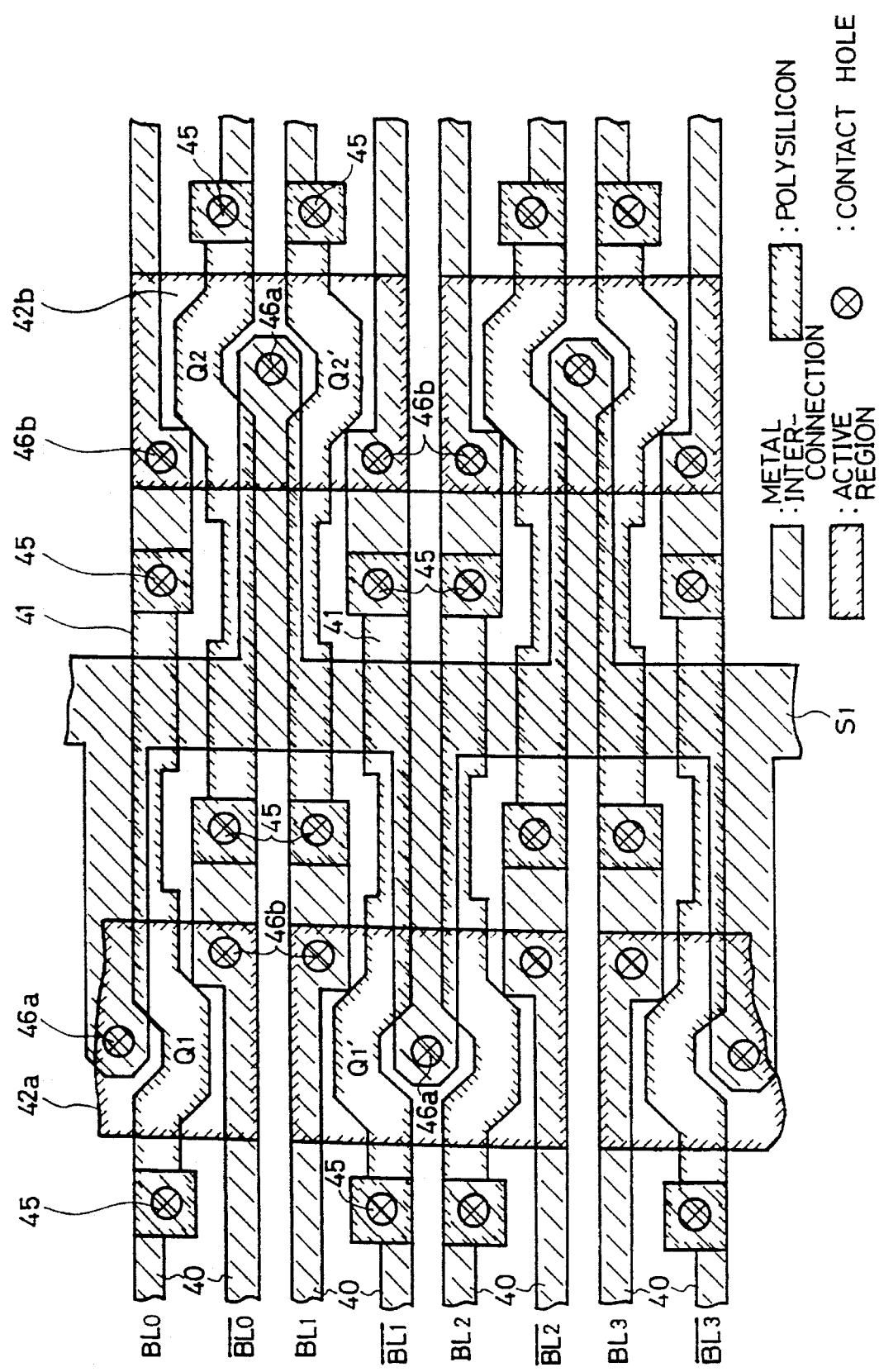
FIG. 15 shows the layout of a sense amplifier part formed by conventional cross-coupled transistors.

As obvious from FIG. 14, the cross point of the bit line $\overline{BL_1}$ is formed to overlap with the gate of the transistor $Q_1$' substantially similarly to conventional layout of sense amplifiers as shown in FIG. 15, so that such cross point causes no increase in bit line length. Referring to FIG. 14, reference numerals 42a and 42b indicate n-channel transistor active regions.

In this example, the manner of intersection of the paired bit lines is identical to that of the device as shown in FIG. 5, so that capacitive coupling noises applied to the bit line pairs from adjacent bit lines are completely cancelled. Active restore circuits are also provided at the cross point parts to include cross points in structure similar to that shown in FIG. 14. In this case, the transistors $Q_1$, $Q_1$', $Q_2$ and $Q_2$' may be replaced by $Q_3$, $Q_3$', $Q_4$ and $Q_4$'.

Figure 16:
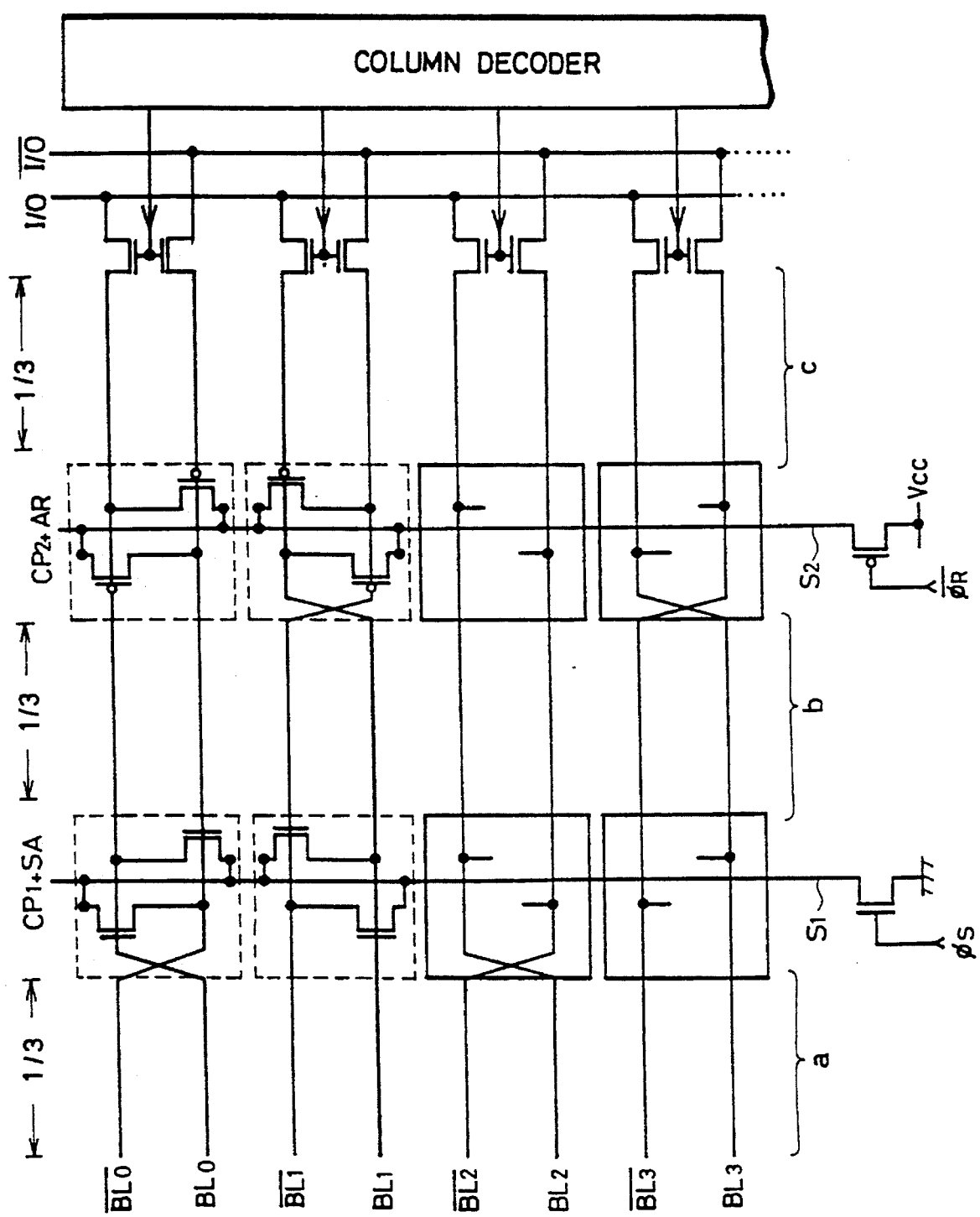
FIG. 16 shows a further improved example of the present invention.

FIG. 16 shows the structure of a memory cell array according to a further improved example of the present invention. This example is different from that shown in FIG. 13 in that respective bit lines are equally divided into three blocks a, b and c so that sense amplifiers SA and cross points $CP_1$ are provided between the blocks a and b and active restore circuits AR and cross points $CP_2$ are arranged between the blocks b and c, to remove portions of only cross points. Since the bit lines are equally divided into three blocks, capacitive coupling noises, which can be completely removed in the case of the four equally divided blocks, are merely reduced to ⅓, while portions of only cross points, which cause increase in bit line length, can be completely removed.

Although the cross points are provided in the sense amplifier parts and the active restore circuits included in the semiconductor memory device in each of the aforementioned improved examples, a similar effect can be attained by a device having only sense amplifiers provided with cross points.

According to the present invention as hereinabove described, one or more cross points are provided in each bit line pair so that values of capacitance between respective ones of the paired bit lines and adjacent bit line pairs are equal to each other, whereby lowering of readout voltage difference can be prevented, and the readout margin is expanded while the soft error rate is improved.

Further, when dummy word line decoder means is provided for selecting one from a plurality of dummy word lines so that the same is connected to a bit line paired with that to which selected memory cells are connected, a dummy cell system applicable to a device having bit line pairs including cross points can be implemented to improve reliability.

In addition, when cross points on respective bit line pairs for substantially equalizing values of capacitance between respective ones of paired bit lines and adjacent bit line pairs are provided in sense amplifier parts and/or active restore circuit parts, excessive increase in bit line length can be advantageously prevented in layout.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of memory cells arrayed in a matrix of rows and columns;

a plurality of word lines connected with respective rows of said plurality of memory cells;

a plurality of bit line pairs connected with respective columns of said plurality of memory cells;

said matrix having a plurality of dividing regions, dividing said matrix into a plurality of blocks of memory cell rows, said blocks located along the direction of the length of said bit lines, each dividing region including portions of at least one bit line pair interchanged at the dividing region in location with each other;

a plurality of reference word lines connected to a plurality of reference potential generating means for applying a reference potential to bit lines; and a reference decoder for selecting at least one of said plurality of reference word lines in response to information identifying one of said blocks to which a selected word line corresponds and information identifying a position of a selected word line in the block to control connection of said reference potential to a corresponding bit line.

2. A semiconductor memory device comprising a plurality of memory cells arrayed in a matrix of rows and columns, a plurality of bit lines each connected with a column of said plurality of memory cells, said plurality of bit lines arrayed in bit line pairs and a plurality of sense amplifiers, each of said sense amplifiers connected to a respective pair of bit lines for detecting and amplifying a potential difference between the bit lines of the respective pair of bit lines, and a plurality of word lines connected with respective rows of said memory cells, said matrix having a plurality of dividing regions, dividing said matrix into a plurality of blocks of respective memory cell rows along the direction of the length of said bit lines, each dividing region including portions of at least one bit line pair interchanged at the dividing region in location with each other;

at least two pairs of reference word lines located on one side of an adjacent one of said dividing regions and connected to a plurality of reference potential generating means for applying a reference potential to respective bit lines;

each reference word line pair being associated with said bit line pairs in a distinct topological order, a first topological order associating a first reference word line of a first reference word line pair with alternate bit lines of said bit line pairs and associating a second reference word line of said first reference word line pair with the remaining bit lines; and a reference decoder, responsive to a block indicating signal for indicating a block to which a selected word line corresponds and to a position indicating signal for indicating a position of the selected word line in the indicated block, for selecting and activating a reference word line such that a reference potential is coupled to one of said bit lines of said pairs of bit lines whereby said one bit line connected to the reference potential provides a reference bit line for a corresponding one of said sense amplifiers.

3. A semiconductor memory device as recited in claim 1, wherein said plurality of reference word lines comprises one or more pairs of reference word lines, a first reference word line of each reference word line pair being associated with a respective one of said plurality of reference potential generating means connected to one bit line in each bit line pair and a second reference word line of each reference word line pair being associated with a respective one of said plurality of reference potential generating means connected with the remaining bit line in each bit line pair.

4. A semiconductor memory device as recited in claim 1, wherein said reference potential generating means is a dummy memory cell.

* * * * *